United States Patent
Yang et al.

(10) Patent No.: US 7,482,621 B2
(45) Date of Patent: Jan. 27, 2009

(54) REWRITABLE NANO-SURFACE ORGANIC ELECTRICAL BISTABLE DEVICES

(75) Inventors: Yang Yang, Los Angeles, CA (US); Liping Ma, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/542,843

(22) PCT Filed: Feb. 2, 2004

(86) PCT No.: PCT/US2004/002932

§ 371 (c)(1), (2), (4) Date: Jul. 20, 2005

(87) PCT Pub. No.: WO2004/070789

PCT Pub. Date: Aug. 19, 2004

(65) Prior Publication Data

US 2006/0131560 A1    Jun. 22, 2006

Related U.S. Application Data

(60) Provisional application No. 60/444,748, filed on Feb. 3, 2003.

(51) Int. Cl.
*H01L 29/08* (2006.01)
*H01L 35/24* (2006.01)
*H01L 51/00* (2006.01)

(52) U.S. Cl. ............... 257/40; 257/1; 257/2; 257/3; 257/4; 257/5; 257/E47.001; 257/E47.005; 257/E27.002; 257/E29.001; 257/E29.002; 257/E29.068; 257/E29.079; 257/E29.08

(58) Field of Classification Search ....... None
See application file for complete search history.

(56) References Cited

U.S. PATENT DOCUMENTS 3,719,933 A    3/1973    Wakabayashi et al.

(Continued)

FOREIGN PATENT DOCUMENTS

WO    WO 01/71814 A1    9/2001

(Continued)

OTHER PUBLICATIONS

Ma et al, Organic Bistable Light-Emitting Devices, Aplied Physics Letters, vol. 80, No. 3, pp. 362-364. Jan. 21, 2002.*

(Continued)

*Primary Examiner*—Andy Huynh
*Assistant Examiner*—Hoang-Quan T Ho
(74) *Attorney, Agent, or Firm*—Venable LLP; Henry J. Daley

(57) ABSTRACT

A bistable electrical device that is convertible between a low resistance state and a high resistance state. The device includes at least one layer of organic low conductivity material that is sandwiched between two electrodes. A buffer layer is located between the organic layer and at least one of the electrodes. The buffer layer includes particles in the form of flakes or dots of a low conducting material or insulating material that are present in a sufficient amount to only partially cover the electrode surface. The presence of the buffer layer controls metal migration into the organic layer when voltage pulses are applied between the electrodes to convert the device back and forth between the low and high resistance states.

14 Claims, 18 Drawing Sheets

U.S. PATENT DOCUMENTS

| | | | |
|---|---|---|---|
| 3,833,894 A | 9/1974 | Aviram et al. | |
| 4,144,418 A | 3/1979 | Girard et al. | |
| 4,371,883 A | 2/1983 | Potember et al. | |
| 4,507,672 A * | 3/1985 | Potember et al. | 438/99 |
| 4,652,894 A | 3/1987 | Potember et al. | |
| 4,663,270 A | 5/1987 | Potember et al. | |
| 4,987,023 A | 1/1991 | Sato et al. | |
| 5,075,738 A * | 12/1991 | Matsuda et al. | 257/49 |
| 5,136,212 A | 8/1992 | Eguchi et al. | |
| 5,238,607 A | 8/1993 | Herron et al. | |
| 5,543,631 A * | 8/1996 | Weinberger | 257/40 |
| 5,563,424 A | 10/1996 | Yang et al. | |
| 5,569,565 A | 10/1996 | Kawakami et al. | |
| 5,610,898 A | 3/1997 | Takimoto et al. | |
| 5,761,115 A | 6/1998 | Kozicki et al. | |
| 6,015,631 A | 1/2000 | Park | |
| 6,055,180 A | 4/2000 | Gudesen et al. | |
| 6,122,031 A | 9/2000 | Terada et al. | |
| 6,208,553 B1 | 3/2001 | Gryko et al. | |
| 6,229,047 B1 | 5/2001 | Glaser et al. | |
| 6,600,473 B1 * | 7/2003 | Kobayashi et al. | 345/97 |
| 6,631,085 B2 | 10/2003 | Kleveland et al. | |
| 6,774,880 B2 | 8/2004 | Kobayashi | |
| 6,828,685 B2 | 12/2004 | Stasiak | |
| 6,852,555 B1 | 2/2005 | Roman et al. | |
| 6,950,331 B2 * | 9/2005 | Yang et al. | 365/148 |
| 2002/0010261 A1 | 1/2002 | Callahan et al. | |
| 2002/0031602 A1 * | 3/2002 | Zhang | 427/58 |
| 2002/0163828 A1 | 11/2002 | Krieger et al. | |
| 2002/0163831 A1 | 11/2002 | Krieger et al. | |
| 2002/0195600 A1 | 12/2002 | Leuschner | |
| 2003/0053350 A1 | 3/2003 | Krieger et al. | |
| 2003/0063362 A1 * | 4/2003 | Demir et al. | 359/240 |
| 2003/0155602 A1 | 8/2003 | Krieger et al. | |
| 2003/0173612 A1 | 9/2003 | Krieger et al. | |
| 2003/0178667 A1 | 9/2003 | Krieger et al. | |
| 2003/0179633 A1 | 9/2003 | Krieger et al. | |
| 2004/0026714 A1 | 2/2004 | Krieger et al. | |
| 2004/0026729 A9 * | 2/2004 | Krieger et al. | 257/306 |
| 2004/0159835 A1 | 8/2004 | Krieger et al. | |
| 2004/0160801 A1 | 8/2004 | Krieger et al. | |
| 2004/0246768 A1 | 12/2004 | Krieger et al. | |
| 2005/0111071 A1 | 5/2005 | Kojima et al. | |

FOREIGN PATENT DOCUMENTS

| | | | |
|---|---|---|---|
| WO | WO0237500 A1 * | 5/2002 | |
| WO | WO 02/091496 A2 | 11/2002 | |
| WO | WO 2004/064074 | 7/2004 | |

OTHER PUBLICATIONS

Schlaf et al. Photoemission Spectroscopy of LiF Coated Al and Pt Electrodes. Journal of Applied Physics. vol. 84, No. 12. pp. 6729-6736.*

Dewald, J.F., A.D. Pearson, W.R. Northover and W.F. Peck, Jr., "Semi-Conducting Glasses", Electrochem. Soc., 109, 243c (1962).

Yu, G. Kriger, N.F. Yudanov, I.K. Igumenov and S.B. Vashchenko, "Study of Test Structures of a Molecular Memory Element", J. Struct. Chem., 34 (1993).

McBrayer, J.D., R.M. Swanson and T.W. Sigmon, "Diffusion of Metals in Silicon Dioxide",J. Electrochem. Soc. 133, 1242 (1986).

Brown, W.D. and J.E. Brewer, "Nonvolatile Semiconductor Memory Technology", IEEE Press, New York (1998).

Chen, J., W. Wang, M.A. Reed, A.M. Rawlett, D.W. Price and J.M. Tour, "Room-Temperature Negative Differential Resistance in Nanoscale Molecular Junctions", Appl. Phys. Lett. 77, 1224 (2000).

Beeler, F., O.K. Andersen and M. Scheffler", Theoretical Evidence for Low-Spin Ground States of Early Interstitial and Late Substitutional 3d Transition-Metal Ions in Silicon", Phys. Rew. Lett. 55, 1498 (1985).

Istratov, A.A. and E.R. Weber, "Physics of Copper in Silicon", J. Electrochemical Society, 149, G21 (2002).

Istratov, A.A., C. Flink, H. Hieslmair, S.A. McHugo and E.R. Weber, "Diffusion, Solubility and Gettering of Copper in Silicon", Materials Science and Engineering Technology B, 72, 99 (2000).

Lee, K.L., C.K. Hu and K.N. Tu, "In-Situ Scanning Electron Microscope Comparision Studies on Electromigration of Cu and Cu(Sn) Alloys for Advanced Chip Interconnects", J. Appl. Phys. 78, 4428-4437 (1995).

Loke, A.L.S., J.T. Wetzel, P.H. Townsend, T. Tanabe, R.N. Vrtis, M.P. Zussman, D. Kumar, C. Ryu and S.S. Wong, "Kinetics of Copper Drift in Low-Kappa Polymer Interlevel Dielectrics", IEEE Transactions on Electron Devices 46, 2178 (1999).

Ovshinsky, S.R., "Localized States in the Gap of Amorphous Semiconductors", Phys. Rev. Lett., vol. 36 (No. 24), Jun. 14, 1976, p. 1469-1472.

Hovel, H.J. and J.J. Urgell, "Switching and Memory Characteristics of ZnSe—Ge Heterojunctions", J. Appl. Phys. 42, 5076 (1971).

Kumai, R., Y. Okimoto and Y. Tokura, "Current-Induced Insulator-Metal Transition and Pattern Formation in an Organic Charge-Transfer Complex", Science, 284 1645 (1999).

Potember, R.S., T.O. Poehler and D.O. Cowan, "Electrical Switching and Memory Phenomena in Cu-TCNQ Thin Films", Appl. Phys. Lett. 34, 407 (1979).

Garnier, F., R. Hajlaoui, A. Yassar and P. Shirakawa, "All-Polymer Field-Effect Transistor Realized by Printing Techniques", Science 265, 1684 (1994).

Hide, F., M.A. Diaz-Garcia, B.J. Schwartz, M.R.A. Andersson, Q. Pei and A.J. Heeger, Science 273, 1883 (1997).

Kumai, R., Y. Okimoto and Y. Tokura, "Current-Induced Insulator-Metal Transition and Pattern Formation in an Organic Charge-Transfer Complex", Science 284, 1645 (1999).

Fujita, W. and K. Awaga, "Room-Temperature Magnetic Bistability in Organic Radical Crystals", Science, vol. 286 p. 261 (1999).

Burroughes, J.H., D.D.C. Bradley, A.R. Brown, R.N. Marks, K. Mackay, R.H. Friend, P.L. Burn and A.B. Holmes, "Light-Emitting Diodes Based on Conjugated Polymers", Nature, vol. 347, p. 539 (1990).

Yamada, T., D. Zou, H. Jeong, Y. Akaki and T. Tsutsui, "Recoverable Degradation and Internal Field Forming Process Accompanied by the Orientation of Dipoles in Organic Light Emitting Diodes", Synthetic Metals, 111-112, 237 (2000).

Liu, J., Y. Shi, L.P. Ma and Y. Yang, "Device Performance and Polymer Morphology in Polymer Light Emitting Diodes: The Control of Device Electrical Properties and Metal/Polymer Contact", J. Appl. Phys. 88, 605 (2000).

Hamada, Y., C. Adachi, T. Tsutsui and S. Saito, "Blue-Light-Emitting Organic Electroluminescent Devices with Oxadiazole Dimer Dyes as an Emitter", Jpn. J. Appl. Phys. 31, 1812 (1992).

Rosenberg, R., D.C. Edelstein, C.K. Hu, and K.P. Rodbell, "Copper Metallization for High Performance Silicon Technology", Annual Rev. Materials Science, 30, 229 (2000).

Kaloyeros, A.E. and E. Eisenbraun, "Ultrathin Diffusion Barriers/Liners for Gigascale Copper Metallization", Annual Rev. Materials Science, 30, 363 (2000).

Brown, W.D. and J.E. Brewer, "Nonvolatile Semiconductor Memory Technology", IEEE Press, New York (1998).

Ma, L.P., S.M. Pyo, Q.F. Xu and Y. Yang, "Nonvolatile Electrical Bistability of Organic/Metal-Nanocluster/Organic System", Appl. Phys. Lett. 82, 1419 (2003).

Ma, L.P., J. Liu and Y. Yang, "Organic Electrical Bistable Devices and Rewritable Memory Cells", Appl. Phys. Lett. 80, 2997 (2002).

Ma, L.P., J. Liu, S.M. Pyo and Y. Yang, "Organic Bistable Light-Emitting Devices", Appl. Phys. Lett. 80, 362 (2002).

Ma, L.P., J. Liu, S.M. Pyo, Q.F. Xu and Y. Yang, "Organic Bistable Devices", Mol. Cryst. Liq. Cryst. 378, 185 (2002).

Nakayama, K., K. Kojima, Y. Imai, T. Kasai, S. Fukushima, A. Kitagawa, M. Kumeda, Y. Kakimoto and M. Suzuki, "Nonvolatile Memory Based on Phase Change in Se-Sb-Te Glass", J. J. Appl. Phys., Part 1, 42 (2A), 404 (2003).

Ostraat, M.L., J.W. De Blauwe, M.L. Green, L.D. Bell, M.L. Brongerma, J.R. Casperson, C. Flagan and H.A. Atwater, , "Synthesis and Characterization of Aerosol Silicon Nanocrystal Nonvolatile Floating-Gate Memory Devices", Appl. Phys. Lett. 79, 433 (2001).

Ma, L.P., W.J. Yang, S.S. Xie and S.J. Pang, "Ultrahigh Density Data Storage from Local Polymerization by a Scanning Tunneling Microscope", Appl. Phys. Lett. 73, 3303 (1998).

Segui, Y., Ai Bui and H. Carchano, "Switching in Polystyrene Films: Transition from On to Off State", J. Appl. Phys. 47, 140 (1976).

Loke, A.L.S., J.T. Wetzel, P.H. Townsend, T. Tanabe, R.N. Vrtis, M.P. Zussman, D. Kumar, C. Ryu and S.S. Wong, "Kinetics of Copper Drift in Low-Kappa Polymer Interlevel Dielectrics", IEEE Transactions on Electron Devices 46, 2178 (1999).

Wang, M.T., Y.C. Lin, and M.C. Chen, "Barrier Properties of Very Thin Ta and TaN layers Against Copper Diffusion", J. Electrochemical Society, 145, 2538 (1998).

Faltermeier, C., C. Goldberg, M. Jones, A. Upham, D. Manger, G. Peterson, J. Lau, A.E. Kaloyeros, B. Arkles, and A. Paranjpe, "Barrier Properties of Titanium Nitride Films Grown by Low Temperature Chemical Vapor Deposition from Titanium Tetraoidide", J. Electrochemical Society, 144, 1002 (1997).

Krishnamoorthy, A., K. Chanda, S.P. Murarka, G. Ramanath and J.G. Ryan, "Self-Assembled Near-Zero-Thickness Molecular Layers as Diffusion Barriers for Cu Metallization", Appl. Phys. Lett. 78, 2467 (2001).

Lane, M.W., E.G. Liniger and J.R. Lioyd, "Relationship Between Interfacial Adhesion and Electromigration in Cu Metallization", J. Appl. Phys. 93, 1417 (2003).

Istratov, A.A., C. Flink, H. Hieslmair, E.R. Weber and T. Heiser, "Intrinsic Diffusion Coefficient of Interstitial Copper in Silicoin", Phys. Rev. Lett. 81, 1243 (1998).

Sprang, H. A. van, and J.L. M. van de Venne, "Influence of the Surface Interaction on Threshold Values in the Cholestericnematic Phase Transition", J. Appl. Phys. 57, 175 (1985).

Boyd, G.D., J. Cheng and P.D.T. Ngo, "Liquid-Crystal Orientational Bistability and Nematic Storage Effects", Appl. Phys., Lett. 36, 556 (1980).

Gruler, H. and L. Cheung, "Dielectric Alignment in an Electrically Codnucting Nematic Liquid Crystal", J. Appl. Phys. 46, 5097 (1975).

Patel, J.S., "Room-Temperature Switching Behavior of Ferroelectric Liquid Crystals in Thin Cells," Appl. Phys. Lett. 47, 1277 (1985).

Yang, K.H., T.C. Chieu and S. Osofsky, "Depolarization Field and Ionic Effects on the Bistability of Surface-Stabilized Ferroelectric Liquid-Crystal Devices", Appl. Phys. Lett. 55, 125 (1989).

The Electrochemcial Society—Current Affairs—Abstracts of "Recent News" Papers, Presented at Electronics Division Semiconductor Symposia, Los Angeles, CA (1962).

Hide, F., M.A. Diaz-Garcia, B.J. Schwartz, M.R.A. Andersson, Q. Pei and A.J. Heeger, Science 273, 1833 (1996).

Silva, et al., Bistable Switching And Memory Devices; Journal of non-Crystalline Solids; (1970) oo, 316-333 No. Holland Publishing Co., Amsterdam.

Bozano, et al; Mechanism for Bistability in Organic Memory Elements; Applied Physics Letters, (2004); vol. 84, No. 4, pp. 607-609; 2004 American Institute of Physics.

Hua, et al.; New Organic Bistable Films for Ultrafast Electric Memories; Applied Surface Science, 169-170 (20010 pp. 447-451 ,Elsevier Science B.V.

Beinhoff, et al., Poybiphenymethylenes: New Polymers for Bistable Organic Switches; Polymeric Materials: Science and Engineering 90, (2004) 211, 212, U.S.

Sezi, et al.; Organic Materials for High-Density NonVolatile Memory Applications; Proc. IEEE Int. Elec. Dev. Meeting; (2003); Germany.

Kevorkian, et al.; Bistable Switching in Organic Thin Films; Discussions of the Faraday Society, 51, (1971) pp. 139-142; U.S.

Pei, Qibing et al., Polymer Light-Emitting Electrochemical Cells, Science, New Series, vol. 269, No. 5227 (Aug. 25, 1995), pp. 1086-1088.

Kolega et al., Langmiur 1998, vol. 14, p. 5469-5478.

K. Takimoto, H. Kawade, E. Kishi, K. Yano, K, Sakai, K. Hatanaka, K. Eguchi, and T. Nakagiri, Appl. Phys. Lett., 61, 3032 (1992).

H.J. Gao, K. Sohlberg, Z.Q. Xue, H.Y. Chen, S.M. Hou, L.P. Ma, X.W. Fang, X.W. Fang, S.J. Pang, and S.J. Pennycook, Phys. Rew. Lett. 84, 1780 (2000).

A. Bandyopadhyay and A.J. Pal, Appl. Phys. Lett. 82, 1215 (2003).

H.S. Majumdar, A. Bandyopadyay, A. Bolognesi, and A. J. Pal, J. Appl. Phys. 91, 2433 (2002).

D.M. Taylor and C. A. Mills, J. Appl. Phys. 90, 306 (2001).

Bachtold, Adrian et al., "Logic Circuits with Carbon Nanotube Transistors", Science, vol. 294, Nov. 9, 2001, pp. 1317-1320.

Duan, Xiangfeng et al., "Indium Phosphide Nanowires as Building Blocks for Nanoscale Electronic and Optoelectronic Devices", Nature, vol. 49, Jan. 4, 2001, pp. 66-69.

Gudiksen, Mark S. et al., "Growth of Nanowire Superlattice Structures for Nanoscale Photonics and Electronics", Nature, vol. 415, Feb. 7, 2002, pp. 617-620.

Huynh, Wendy U. et al., "Hybrid Nanorod-Polymer Solar Cells", Science, vol. 295, Mar. 29, 2002, pp. 2425-2427.

Adams, David M. et al., "Charge Transfer on the Nanoscale: Current Status", J. Phys. Chem. B., 2003, vol. 107, No. 28, pp. 6668-6697.

Kamat, Prashant V. et al., "Electrochemical Modulation of Fluorophore Emission on a Nanostructured Gold Film", Angew. Chem. Int. Ed. 2002, vol. 41, No. 15, pp. 2764-2767.

Chen, Shaowei et al., "Gold Nanoelectrodes of Varied Size: Transition to Molecule-Like Charging", Science, vol. 280, Jun. 26, 1998, pp. 2098-2101.

Wuelfing, W. Peter et al., "Electronic Conductivity of Solid-State, Mixed-Valent, Monolayer-Protected Au Clusters", J. Am. Chem. Soc. 2000, vol. 122, No. 46, pp. 11465-11472.

Ouyang, Jianyong et al., "Programmable Polymer Thin Film and Non-Volatile Memory Device", Nature Publishing Group, Nature Materials, vol. 3, Dec. 2004, pp. 918-922.

Hostetler, Michael J. et al., "Alkanethiolate Gold Cluster Molecules with Core Diameters from 1.5 to 5.2 nm: Core and Monolayer Properties as a Function of Core Size", Langmuir, 1998, vol. 14, No. 1, pp. 17-30.

Ouyang, Jianyong et al., "Electric-Field-Induced Charge Transfer Between Gold Nanoparticle and Capping 2-Naphthalenethiol and Organic Memory Cells", Applied Physics Letters, 86, 2005, pp. 123507-1 to 123507-3.

Scheinert, S. et al., J. Appl. Phys., 92 330 (2002).

Chiang, J.C., et al., Synth. Met. 13, 193, (1986). "Polyaniline: Protonic acid doping of the emeraldine form to the metallic regime."

Huang, J., et al., J. Am. Chem. Soc., 25, 314 (2003) "Polianiline Nanofibers: Facile Synthesis and Chemical Sensors".

Virji, S., et al. Nano Lett., 4, 491 (2004). "Pollyaniline Nanofiber Gas Sensors: Examiner of Response Mechanisms".

Huang, J., et al., J. Am. Chem. Soc., 126, 851 (2004). "A General Chemical Route to Polyaniline Nanofibers".

Furukawa, T., Adv. Colloid Interface Sci., 71-72, 183 (1997). "Structure and functional properties of ferroelectric polymer".

Tsuyoshi, T., et al., App. Phys. Lett., 83, 4978 (2003). "Electrical carrier-injection and transoprt characteristics of photochromic diarylethene films".

Reed, M.A., et al., Appl. Phys. Lett., 78, 3735 (2001). "Molecular random access memory cell".

Chen, Y., et al, Appl. Phys. Lett. 82, 1610 (2003). "Nanoscale molecular-switch devices fabricated by imprint lithography".

Tang, C.W. et al., "Organic Electroluminescent Diodes", Appl. Phys. Lett. 51 (12), Sep. 21, 1987, p. 913-915.

Friend, R.H. et al., "Electroluminescence in Conjugated Polymers", Nature, vol. 397, Jan. 14, 1999, p. 121-128.

Sariciftci, N.S. et al., "Photoinduced Electron Transfer from a Conducting Polymer to Buckminsterfullerence", Science, vol. 258, Nov. 27, 1992, p. 1474-1476.

Gundlach, D.J. et al., "Pentacene Organic Thin-Film Transistors-Molecular Ordering and Mobility", IEEE Electron Device Letters, vol. 18, No. 3, Mar. 1977, p. 87-89.

Baldo, Marc et al., "Organic Vapor Phase Deposition", Adv. Mater. 1998, 10, No. 18, p. 1505-1514.

Carchano, H. et al., "Bistable Electrical Switching in Polymer Thin Films", Applied Physics Letters, vol. 19, No. 19, Nov. 15, 1971, p. 414-415.

Xu, W. et al., "Two New All-Organic Complexes with Electrical Bistable States", *Appl. Phys. Lett.* 67 (15), Oct. 9, 1995, p. 2241-2242.

Ma, L.P. et al., "Data Storage with 0.7 nm Recording Marks on a Crystalline Organic Thin Film by a Scanning Tunneling Microscope", *Applied Physics Letters*, vol. 73, No. 6, Aug. 10, 1998, p. 850-852.

Henisch, H.K. et al., "Switching in Organic Polymer Films" *Applied Physics Letters*, vol. 24, No. 12, Jun. 15, 1974, p. 589-591.

Bryce, Martin R., "Tetrathiafulvalenes as π-Electron Donors for Intramolecular Charge-Transfer Materials", *Advanced Materials*, 1999, 11, No. 1, p. 11-23.

Martin, Nazario et al., "Evidence for Two Separate One-electron Transfer Events in Excited Fulleropyrrolidine Dyads Containing Tetrathiafulvalene (TTF)", *J. Phys. Chem.* A 2000, 104, p. 4648-4657.

* cited by examiner (a)

(b)

US 7,482,621 B2

REWRITABLE NANO-SURFACE ORGANIC ELECTRICAL BISTABLE DEVICES

CROSS-REFERENCE TO RELATED APPLICATION

This application is a national phase of International Application No. PCT/US04/02932, filed Feb. 2, 2004, and claiming priority of U.S. Provisional Application No. 60/444,748, filed Feb. 3, 2003, the entire contents of which are incorporated herein by reference.

The U.S. Government has a paid-up license in this invention and the right in limited circumstances to require the patent owner to license others on reasonable terms as provided for by the terms of the Air Force Office of Scientific Research Grant No. F49620-01-1-0427, and the Office of Naval Research (ONR) Grant No. N00014-01-1-0855.

BACKGROUND OF THE INVENTION

1. Field of the Invention

The present invention relates generally to electronic devices that utilize elements that exhibit bistable electrical behavior. More particularly, the present invention is directed to organic semiconductor devices including electrically programmable nonvolatile memory devices and switches.

2. Description of Related Art

The publications and other reference materials referred to herein to describe the background of the invention and to provide additional details regarding its practice are hereby incorporated by reference. For convenience, the reference materials are numerically referenced and identified in the appended bibliography.

Many electronic memory and switching devices typically employ some type of bistable element that can be converted between a high impedance state (off-state) and a low impedance state (on-state) by applying an electrical voltage or other type of writing input to the device. This threshold switching and memory phenomena have been demonstrated in both organic and inorganic thin-film semiconductor materials. For example, this phenomenon has been observed in thin films of amorphous chalcogenide semiconductor (1), amorphous silicon (2), organic material (3) and ZnSe—Ge heterostructures (4).

The above materials have been proposed as potential candidates for nonvolatile memories. The mechanism of electrical bistability has been attributed to processes such as field and impact ionization of traps, whereas in chalcogenide semiconductors they involve amorphous to crystalline phase changes. Analogous memory effects in the leakage current of ferroelectric $BaTiO_3$ or $(Pb_{1-y}La_y)(Zr_{1-x})O_3$-based heterostructures have also been reported and discussed in terms of band bending due to spontaneous polarization switching. Electrical switching and memory phenomena have also been observed in organic charge transfer complexes such as Cu-TCNQ[5,6].

A number of organic functional materials have attracted more and more attention in recent years due to their potential use in field-effect transistors (7), lasers (8), memories (9,10) and light emitting diodes and triodes (11,15). Electroluminescent polymers are one of the organic functional materials that have been investigated for use in display applications. In addition to display applications, electroluminescent polymers have been doped with high dipole moment molecules in order to obtain a memory effect (12). This memory effect is observed when dipole groups attached to side chain of the polymer rotate due to application of a threshold bias voltage. Unfortunately, rotation of the dipole groups takes a relatively long time. Also, doping of the polymer reduces the electroluminescence of the doped polymer.

Electronic addressing or logic devices are presently made from inorganic materials, such as crystalline silicon. Although these inorganic devices have been technically and commercially successful, they have a number of drawbacks including complex architecture and high fabrication costs. In the case of volatile semiconductor memory devices, the circuitry must constantly be supplied with a current in order to maintain the stored information. This results in heating and high power consumption. Non-volatile semiconductor devices avoid this problem. However, they have the disadvantage of reduced data storage capability as a result of higher complexity in the circuit design, and hence higher cost.

A number of different architectures have been implemented for memory chips based on semiconductor material. These structures reflect a tendency to specialization with regard to different tasks. Matrix addressing of memory location in a plane is a simple and effective way of achieving a large number of accessible memory locations while utilizing a reasonable number of lines for electrical addressing. In a square grid with n lines in each direction the number of memory locations is $n^2$. This is the basic principle, which at present is implemented in a number of solid-state semiconductor memories. In these types of systems, each memory location must have a dedicated electronic circuit that communicates to the outside. Such communication is accomplished via the grid intersection point as well as a volatile or nonvolatile memory element which typically is a charge storage unit. Organic memory in this type of matrix format has been demonstrated before by using an organic charge transfer complex. However such organic memories require transistor switches to address each memory element leading to a very complex device structure.

Organic Electrical Bistable Devices (OBD's) have been proposed in the past where a metal layer is sandwiched between two organic layers. This sandwich structure is used as an active medium that is interposed between two electrodes. Controllable memory performance has been obtained using this type of configuration. A positive voltage pulse is used for writing, while a reversed bias is used for erasing. The shortcoming of this kind of memory device is that erasure must be performed by applying a reversed bias. In an x-y electrical-addressable memory array application, a diode must be series connected with each memory cell to prevent the so-called "sneak current". In this type of application, it is difficult to apply a reversed bias for erasing. In addition, the middle metal layer makes it technically difficult to pattern the metal layer for each memory cell when the cells are very small.

The diffusion or drift of Cu-ions into semiconductor materials, like silicon, is a well-known and troublesome phenomenon that has an adverse effect on semiconductor devices (16). Generally a diffusion barrier layer is added to prevent Cu metallization (17). Electrical-addressable nonvolatile memory devices have attracted considerable attention in recent years due to their application in information technology. Silicon based floating-gate memory (18), with a response time in the sub-millisecond, has played an important role in the modern electronic devices, such as digital cameras. However, there is always a strong demand for electronic nonvolatile memory devices that are less expensive and better. Organic electrical bistable devices are promising in this regard.

Organic electrical bistable devices with an organic/metal-nanocluster/organic tri-layer structure sandwiched between two electrodes have been made (19). These sandwich structures show nonvolatile memory behavior. Many other methods have also been reported for nonvolatile memory, such as phase change memory (20), programmable metallization cell (21), nano-crystal memory (22), organic memory based on scanning probe microscope (23), and organic memory in charge-transfer complex system (6), polystyrene films (24), and molecular devices (25).

In view of the above, there is a continuing need to provide new and improved electrically bistable structures which may be used in electronic devices, such as memory devices and switches.

SUMMARY OF THE INVENTION

In accordance with the present invention, bistable electrical devices are provided that are convertible between a low resistance (impedance) state and a high resistance (impedance) state. The bistable electrical devices are well suited for use as electrical switching and memory devices. In the present invention, we provide a new kind of organic bistable device (OBD) that utilizes a nano-surface (also referred to as a "buffer layer") located on at least one of the electrodes. The OBD's in accordance with the present invention provide high memory performance without any of the above-mentioned technical difficulties for memory applications.

The organic bistable electrical devices of the present invention generally include a first electrode that has a first electrode surface. A layer of low conductivity organic material having a first surface and a second surface is provided wherein the first surface of the organic layer is in electrical contact with the first electrode surface. A second electrode is provided that includes a second electrode surface. As a feature of the invention, a buffer layer is located between the second electrode surface and the second surface of organic layer. The buffer layer includes particles in the form of flakes or dots of a low conducting material or insulating material that are present in a sufficient amount to only partially cover the second electrode surface. The buffer layer controls metal ion migration from the electrode and provides for the conversion of the bistable electrical device between the low resistance ("on") state and the high resistance ("off") state when an electrical voltage is applied between the first and second electrodes.

The present invention utilizes one or more buffer layers to control the metal ion concentration within the organic layer interposed between two metal electrodes and provide electrical programmable nonvolatile memory devices. Advantages of the memory devices of the present invention include: 1) the memory devices have no conducting layer in between the top and bottom electrodes. Therefore, it is not necessary to pattern the active layer (which is composed of one or more buffer-layers and organic layers) when making x-y memory-cell array type memory devices; 2) the write-read-erase voltage pulse can be the same direction, which is convenient in an x-y electrical-addressable memory array device. This is because in x-y array type devices, a diode must be series connected with each memory cell to prevent the sneak current. In addition, the on-state current is much higher, at 0.1 V bias, the on-state current can go to 2 A/cm². Both the On-state and Off-state are quite stable. As a result, this device is ideal for x-y array type memory and switch application.

The organic bistable electrical devices may be used to form a wide variety of memory devices wherein a memory input element is provided for applying voltage to the organic bistable device to convert the active layer between the low electrical resistance (high conductance) state and the high electrical resistance (low conductance) state. The memory device further includes a memory read-out element which provides an indication of whether the bistable body is in the low or high electrical resistance state. As a feature of the present invention, the memory read-out element may be a light-emitting diode which provides a visual indication of the electrical resistance state of the bistable body.

The above discussed and many other features and attendant advantages of the present invention will become better understood by reference to the detailed description when taken in conjunction with the accompanying drawings.

BRIEF DESCRIPTION OF THE DRAWINGS

FIG. 21(b) is a graph of the real time dynamic Write-Read-Erase cycle test of an exemplary Cu-OBD.

DETAILED DESCRIPTION OF THE INVENTION

Figure 1:
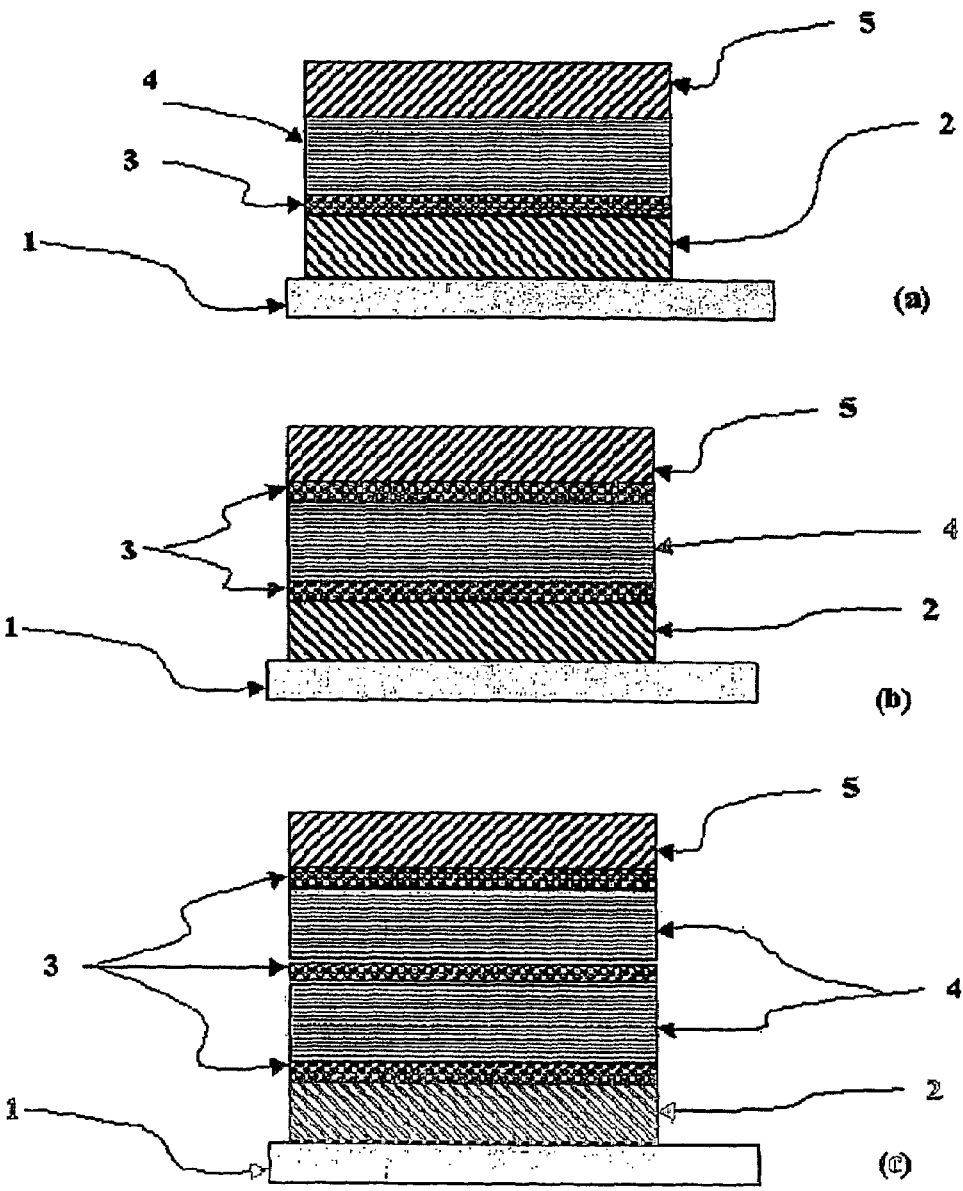
FIG. 1(a) is a diagrammatic representation of a bistable electrical device in accordance with the present invention that utilizes one buffer layer.
FIG. 1(b) is a diagrammatic representation of a bistable electrical device in accordance with the present invention that utilizes two buffer layers.
FIG. 1(c) is a diagrammatic representation of a bistable electrical device in accordance with the present invention that utilizes three buffer layers.

An organic bistable electrical device in accordance with the present invention is shown in FIG. 1. The device includes an organic layer 4 that is sandwiched between a first electrode 5 and a second electrode 2. The organic layer 4 is shown in the form of a layer. However, it will be understood that the organic layer can be provided in any number of different shapes. Organic layers in the form of a thin layer or film are preferred since fabrication techniques for forming thin films are well known.

The organic layer 4 includes a first surface that is in electrical contact with the first electrode 5. The organic layer 4 includes a second surface that is located on the other side of the organic layer 4 and which is in electrical contact with the second electrode 2. The second electrode 2 is typically located on an insulating substrate 1. If desired, the substrate 1 can be either ridged or flexible and made from either organic or inorganic materials that are well-know for use as insulating substrates in electronic devices.

In accordance with the present invention, a buffer layer 3 is provided between the second electrode 2 and the organic layer 4 to provide control of metal ion migration into the organic layer 4. The buffer layer 3 on the anode side is used for a number of purposes. For example, the buffer layer 3 is used to control metal ion injection from the anode by decreasing the metal ion injection barrier at a proper applied voltage pulse ($V_{c1} < V < V_{c2}$) condition to realize the switch-on process. Another purpose is to control metal ion injection from the anode by increasing the copper ion injection barrier at higher applied voltage pulse condition ($V > V_{c2}$) to realize the switch-off process. Another purpose is to control metal ion injection from the anode by keeping the metal ion injection properties (either no injection for Off-state or injection for On-state) at a low applied voltage pulse condition to realize the read process. If desired, the switch-off process can be defined as the writing-process, while the switch-on process can be defined as the erasing process.

The organic bistable electrical device (OBD) is typically connected to an electronic control unit via electrical connections to the electrodes (not shown). The control unit is capable of providing an electrical voltage bias across the organic layer 4 via the two electrodes 2 and 5 to convert the OBD between low resistance (On) and high resistance (Off) states. In addition, the control unit is capable of, among other things, measuring current to determine the electrical resistance of the OBD.

The materials for the electrodes 2 and 5 can be metals or conducting materials like indium tin oxide (ITO). Suitable metals for use as the electrodes include copper (Cu), gold (Au), silver (Ag), aluminum (Al) and other metals that have relatively high diffusion coefficients in the organic layer. Copper is a preferred electrode material with devices utilizing at least one copper electrode being referred to as a "Cu-OBD". Either electrode can be the anode provided that it is copper or a similar metal as set forth above.

The materials for the buffer layer should be insulating or low conducting materials. A variety of low conducting or insulating materials may be used to form the particles (in the form of insulating dots or flakes) that make up the buffer layer. For example, LiF, NaCl and other compounds similar to LiF and NaCl may be used. Such compounds typically form flakes. Metal oxides, such as aluminum oxide ($Al_2O_3$), may be used. These compounds typically form dots. The thickness of the buffer layer is preferably from 1 to 10 nm thick with 2-5 nm being especially preferred. The thickness of the buffer layer can be as great as 50 nm, if desired.

Figure 4:
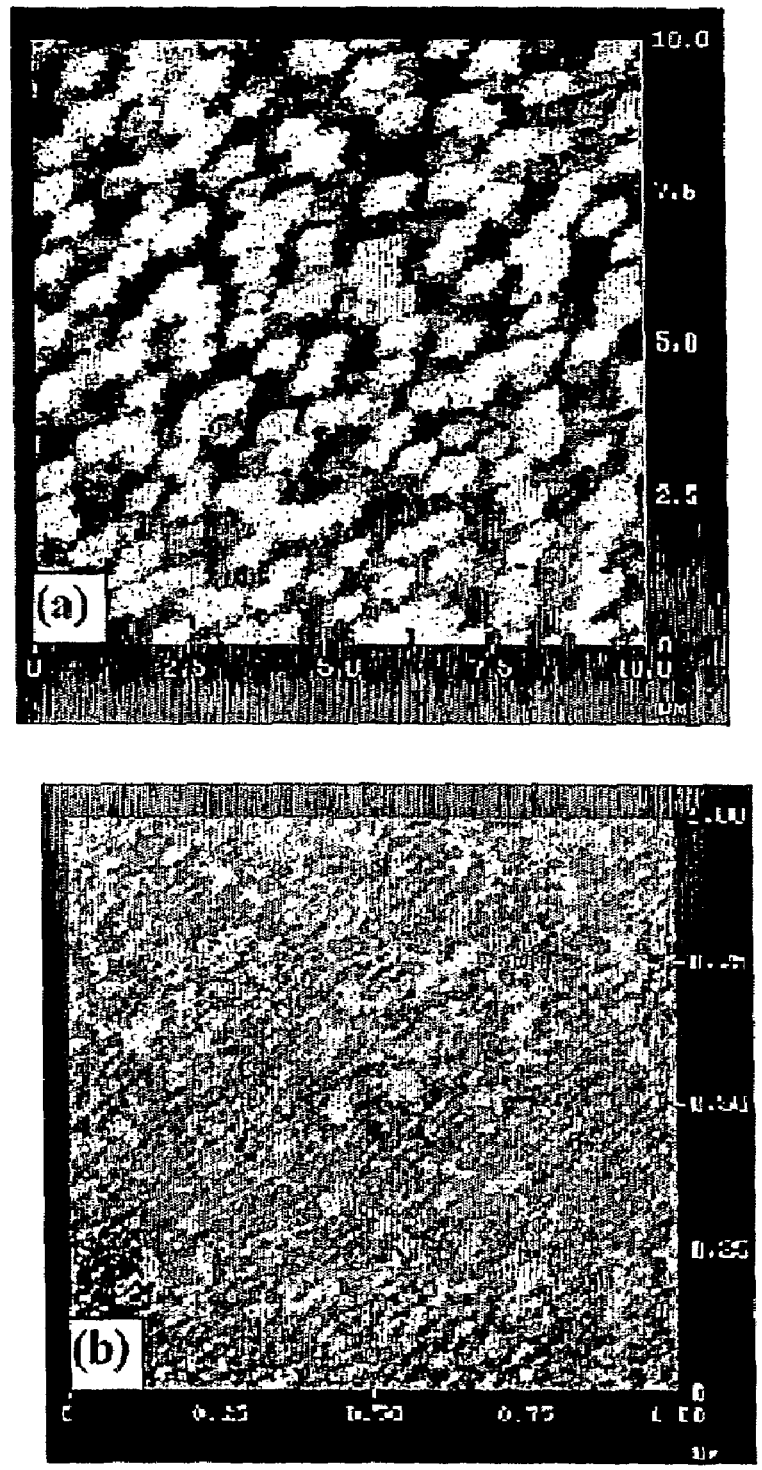
FIG. 4(a) is a scanning tunneling microscope image of the surface of a 10 μm×10 μLiF buffer layer (2.5 nm thickness).
FIG. 4(b) is a scanning tunneling microscope image of the surface of a 1 μm×1 μm copper layer (100 nm thickness).

The buffer layer is composed of small dots or flake-like deposits which are important for the observed electrical bistable behavior. It is preferred that the insulating dots or flakes substantially cover the electrode surface. However, some open spaces should remain between the dots or flakes. FIG. 4(a) is an STM image of a $10\times10\,\mu m^2$ section of a buffer layer which shows LiF flakes on a copper surface. FIG. 4(a) shows what is meant by "substantially" covering the electrode surface. The degree of surface coverage and size of the flakes may be varied from what is shown in FIG. 4(a) provided that the desired properties provided by the buffer layer are not destroyed. The degree of surface coverage and flake or dot size is related to the thickness of the buffer layer. In general, the thicker the buffer layer, the larger the degree of coverage, and the surface morphology may be varied too.

The materials for the organic layer are preferably small conjugated low conductivity organic materials. Suitable low conductivity materials include organic semiconductors. Exemplary organic semiconductors include small molecular organic materials such as 2-amino-4,5-imidazoledicarbonitrile (AIDCN); tris-8-(hydroxyquinoline)aluminum (Alq); 7,7,8,8-tetracyanoquinodimethane (TCNQ); 3-amino-5-hydroxypyrazole (AHP); tris-(8-hydroxyquinolinolato)aluminum (Alq3); and copper or zinc 2,9,16,23-tetra-tert-butyl-29H,31H-phthalocyanine (CuPc or ZnPc). If desired, inorganic materials like silicon, gallium, gallium nitride and similar semi-conductors may be used in place of the organic layer. The so-called "organic layer" is typically from 10 to 1000 nm thick.

The various electrodes, organic layers and buffer layers that make up the organic bistable devices of the present invention can be fabricated by vacuum thermal evaporation methods, spin-coating or continuous-coating techniques which are all well-known in the electronic device manufacturing field.

A second example of an OBD device, according to an embodiment of the current invention, is shown schematically in FIG. 1(b) wherein buffer layers 3 are provided between the organic layer 4 and both electrodes 2 and 5. In FIG. 1(c), a third alternate embodiment is shown wherein two organic layers 4 are sandwiched between electrodes 2 and 5. Three buffer layers 3 are used to separate the two organic layers 4 from each other and to separate the electrodes 2 and 5 from the organic layers. As is apparent, a number of different combinations of organic layers with buffer layers and electrodes are possible.

Examples of practice are as follows:

In the following examples, a number of OBD's were made and tested. The basic structure of the exemplary devices is shown in FIG. 1. Cu was selected for the electrodes due to its high diffusion coefficient (25). The buffer layers were approximately 4 μm thick (unless otherwise noted) and included dielectric materials, such as lithium fluoride (LiF) and aluminum oxide. Materials with low conductivity, good film formability and stability such as 2-amino-4,5-imidazoledicarbonitrile (AIDCN), tris-8-(hydroxyquinoline)aluminum ($Alq_3$), and Zinc 2,9,16,23-tetra-tert-butyl-29H,31H-phthalocyanine (ZnPc) were selected for the organic layers.

The OBD's of the present invention can be fabricated by simple vacuum thermal evaporation methods, spin-coating or continuous-coating techniques. The Cu-OBD's in these examples were fabricated by vacuum thermal evaporation methods. All the depositions were performed in a high vacuum about $1\times10^{-6}$ torr. A preferred process includes depositing all films for device fabrication without breaking the vacuum.

The buffer layer controls Cu ions injection into the organic layer at various applied voltages. At a low critical voltage pulse $V_{c1}$ (generally, ranging from 0.2 to 3 V) it allows Cu ions injection from the anode into the organic layer, which switches the device to high conductance state (On-state), while above a relative high critical voltage $V_{c2}$ (generally above 3 V in 10 nanoseconds width) it can shut down Cu ions injection and restore the device to low conductance state (Off-state). The two states differ in their electrical conductivity by several orders (3-9) of magnitude depending on the device fabrication processing, and can be precisely switched by controlling the $Cu^+$ concentration through the application of external voltage pulses. A small voltage pulse (less than 0.1V, ten nanoseconds width) can be used to read. At no bias condition both On-state and Off-state are quite stable even being heated to 110° C., which makes it suitable for nonvolatile memory application. The On-state current density of the device is quite high (~$2A/cm^2$ @ 0.1V bias). The devices are especially well suited for flash memory applications and for driving light-emitting pixels in display applications.

Figure 2:
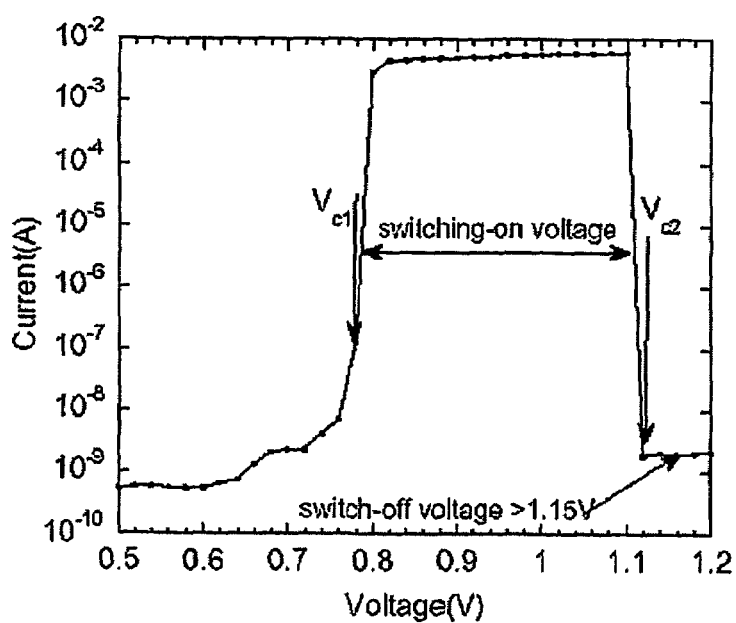
FIG. 2 is a graph of the typical I-V characteristics of a Cu/LiF/AlDCN/Cu device in accordance with the present invention that is initially in the Off-state. The switching-on voltage ranges from $V_{c1}$ to $V_{c2}$. The switching-off voltage is higher than $V_{c2}$. The read voltage is the less than $V_{c1}$.
Figure 3:
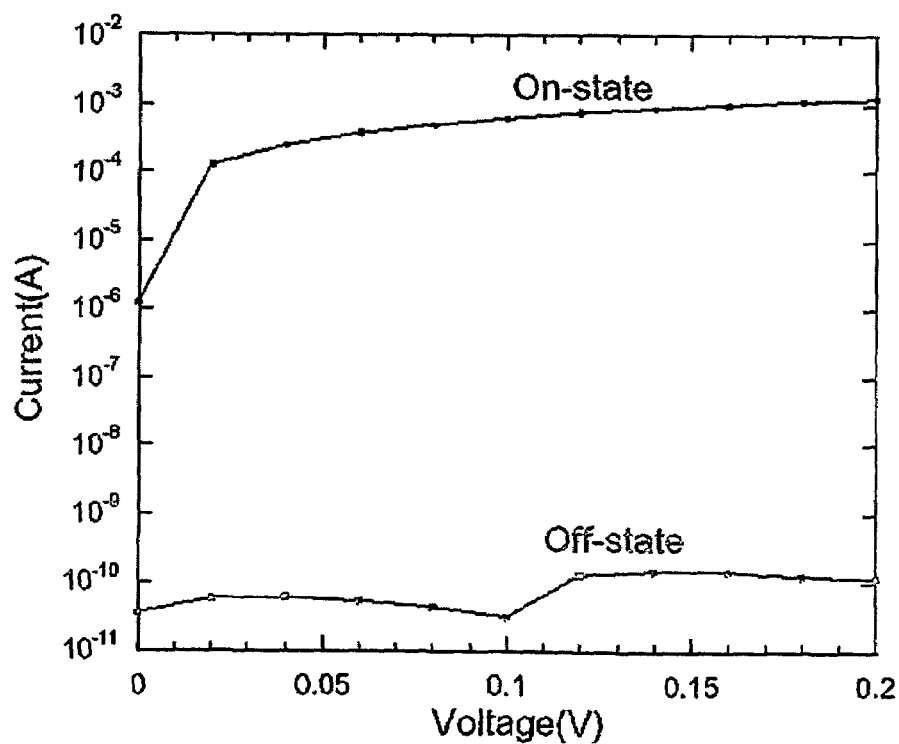
FIG. 3 is a graph of the I-V characteristics of On-state and Off-state for devices in accordance with the present invention. The reading voltage is 0.2 V and the On/Off ratio is about 7 orders in magnitude.

FIG. 2 shows the typical I-V characteristics of the Cu-OBDs when the device is initially in the Off-state (high impedance), the high conductive state can be excited by a voltage V ($V_{c1}<V<V_{c2}$)). Higher voltage ($V>V_{c2}$) can restore the device to the Off-state. The Off-state is stable if the following applied voltage is less than $V_{c1}$. Once the device is excited by the small voltage to the On-state, it will remain at the On-state for prolonged periods of time if the following applied voltage is less than $V_{c2}$. Therefore, we can use very small voltage (0.1 or 0.2V) to read the On-state and Off-state. The On-Off ratio of the devices can be as high as 7 orders in magnitude (See FIG. 3).

It is believed that the OBD devices operate according to the following principles. Copper that diffuses into other materials is in a positively charged state (26), and the copper ions drift in both silicon (27) and organic materials (28), and cause copper metallization. Generally diffusion barrier layers are used to prevent this metallization (29). The diffusion barrier provides an interface adhesion (or an energy barrier) to prevent $Cu^+$ diffusion and metallization (30). For Cu-OBD's, when positive bias is applied, copper is ionized at the innerface of the anode and acts as the $Cu^+$ source. When the energy of $Cu^+$ is high enough (larger than $eV_{c1}$) to overcome the energy barrier, they are injected into the organic layer, and drift towards the cathode. When the $Cu^+$ ions reach the cathode, a continuous $Cu^+$ distribution within the organic layer is established where the organic layer is metalized by the $Cu^+$ and exhibits the ON-state. This is also consistent with the delay time during the switch-ON process as shown later in FIG. 7(a). Providing the delay time is solely caused by the $Cu^+$ traveling time through the organic layer, one can estimate that the drift velocity of $Cu^+$ in AIDCN film is about $5\times10^4$ cm/s under the electric field of $1.2\times10^5$ V/cm, and the diffusivity of $Cu^+$ in AIDCN film is about $10^{-10}$ cm$^2$/s at room temperature, which is smaller than in case of silicon (about $10^{-7}$ cm$^2$/s) (31). By selecting organic materials with a relatively high $Cu^+$ diffusion coefficient, faster switch-ON speeds can be expected.

For Cu-OBDs, when the applied bias is over the second critical voltage ($V_{c2}$), it undergoes the switch-OFF process and the device changes to the OFF-state (FIG. 2), which indicates that $Cu^+$ injection is prohibited while the residual $Cu^+$ within the organic layer drift towards the cathode and is reduced to Cu. Once a gap larger than a percolation threshold is formed within the organic layer where the $Cu^+$ is free, the device will be switched OFF. The rest of Cu ions will continuously drift towards the cathode until no Cu ions remain within the organic layer. Hence, the transition speed from On-state to Off-state is very fast. One possibility of no $Cu^+$-injection at a bias voltage larger than $V_{c2}$ may be due to the dipole alignment of the buffer layer. Since high dipole moment materials are used for the buffer layer, when the applied electric field is high enough, dipole alignment may happen (32), which tremendously increases the energy barrier and prohibits $Cu^+$ injection. The polarized dipoles may restore to a random orientation when the bias is removed (33), allowing the rewritable character of the devices.

The surfaces of the LiF buffer layer and Cu electrodes were investigated by using a scanning tunneling microscope (STM). FIG. 4(a) shows the STM image of an LiF layer with 2.5 nm in thickness on a pre-deposited Cu substrate. It can be seen from FIG. 4(a) that the deposited LiF layer of dots is flake-like, which is important for the observed electrical bistable behavior. FIG. 4(b) shows the STM image of the surface of the deposited Cu electrode layer. It can be seen from FIG. 4(b) that the surface of the Cu layer is quite smooth compared with the LiF layer, which indicates that the surface structure of LiF shown in FIG. 4(a) is caused by LiF itself and not the Cu surface morphology. It is preferred that the insulating dot or flakes substantially cover the electrode surface, but that some open spaces remain between the dots or flakes. FIG. 4(a) shows what is meant by "substantially" covering the electrode surface. The degree of surface coverage may be varied from what is shown in FIG. 4(a) provided that the desired properties provided by the nano-layer are not destroyed. The thickness of the flake or dot layer can range from 1 to 50 nanometers. Thickness on the order of 2 to 5 nanometers is preferred.

Figure 5:
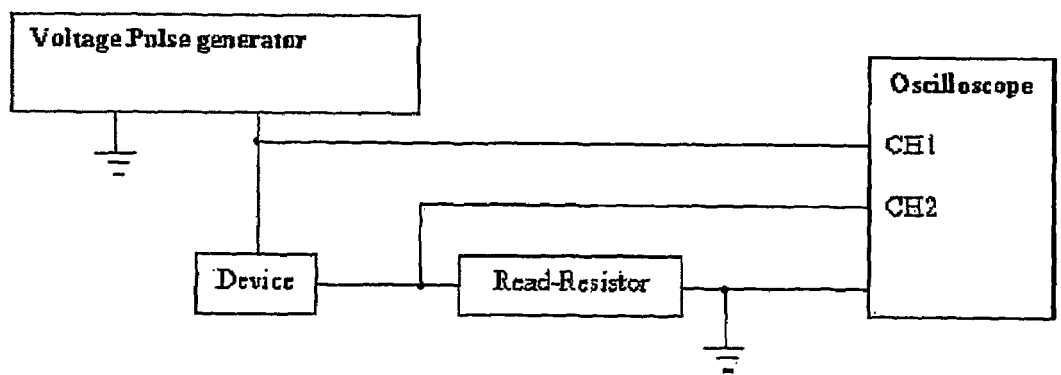
FIG. 5 is a schematic diagram of the measurement system used to measure transient responses of exemplary Cu-OBD's in accordance with the present invention.
Figure 6:
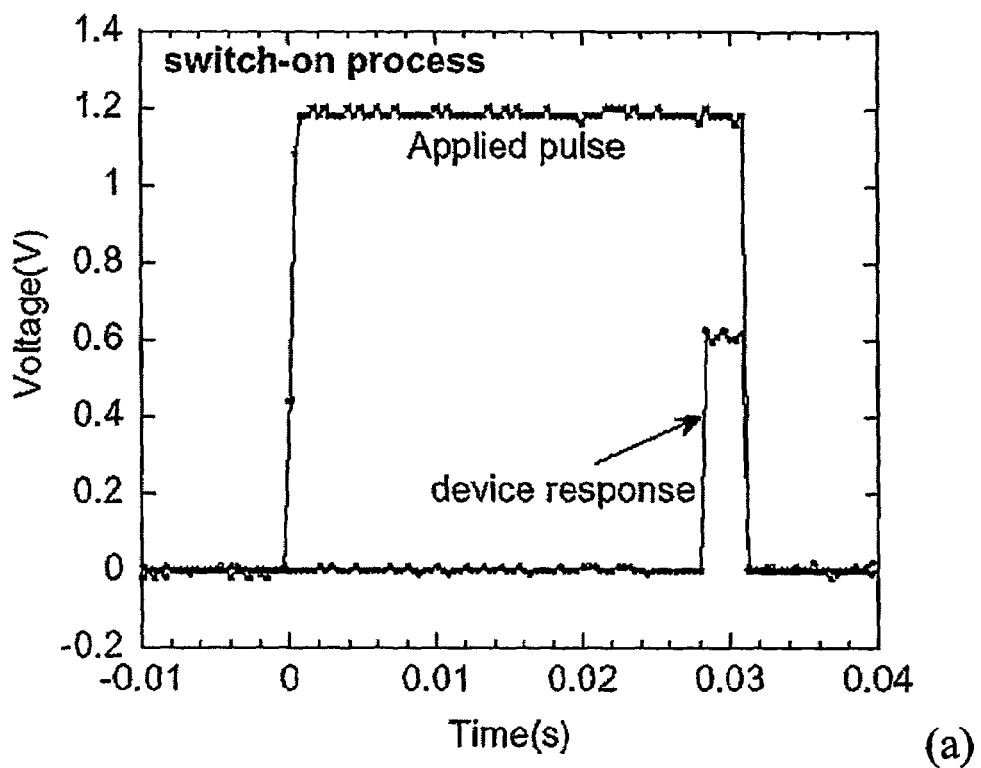
FIG. 6(a) is a graph of the transient response of an exemplary Cu-OBD from the Off-state to On-state. The response of the device was measured by using a 50 Ohm read resistor. The response time is about 28 ms.
FIG. 6(b) is a graph of the transient response of the On-state of an exemplary Cu-OBD. The applied voltage pulse was 0.38V and 100 ns. The device response was measured using a 50 Ohm resistor.
Figure 6:
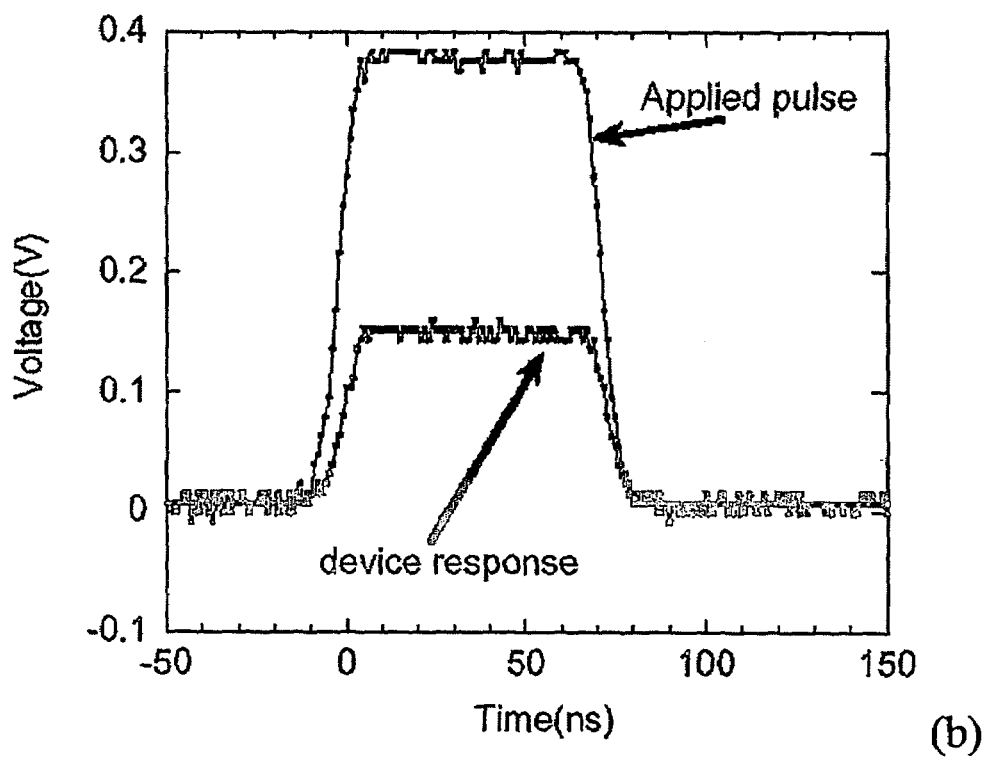

The transition speed of the Cu-OBDs from both the high-resistance state to low resistance state and from the low-resistance state to the high-resistance state is measured by transient measurement. The measurement setup is shown in FIG. 5. The transition speed of the On-to-Off state is relatively slow, about several ten milliseconds. FIG. 6(a) shows the transient response of a Cu-OBD from the Off-state to the On-state. It can be seen from FIG. 6(a) that when the voltage pulse is applied to the device, the device initially keeps its high-resistance state. After about a 28 ms delay time, the device jumps to low-resistance state. The real transition speed from high to low resistance state is quite small as shown by in FIG. 6(a). The tens of milliseconds delay time indicates that $Cu^+$ ions travel from the anode to the cathode. The electrical behavior of the On-state Cu-OBD is like a pure resistor. The transient electrical behavior of the On-state Cu-OBD is shown in FIG. 6(b). It can be seen from FIG. 6(b) that no capacitor effects (charging and discharging) are observed for the on-state Cu-OBDs. The current follows the applied voltage pulse, which indicates that the on-state Cu-OBDs exhibits pure resistor behavior. This conclusion is confirmed by the impedance measurements set forth below.

Figure 7:
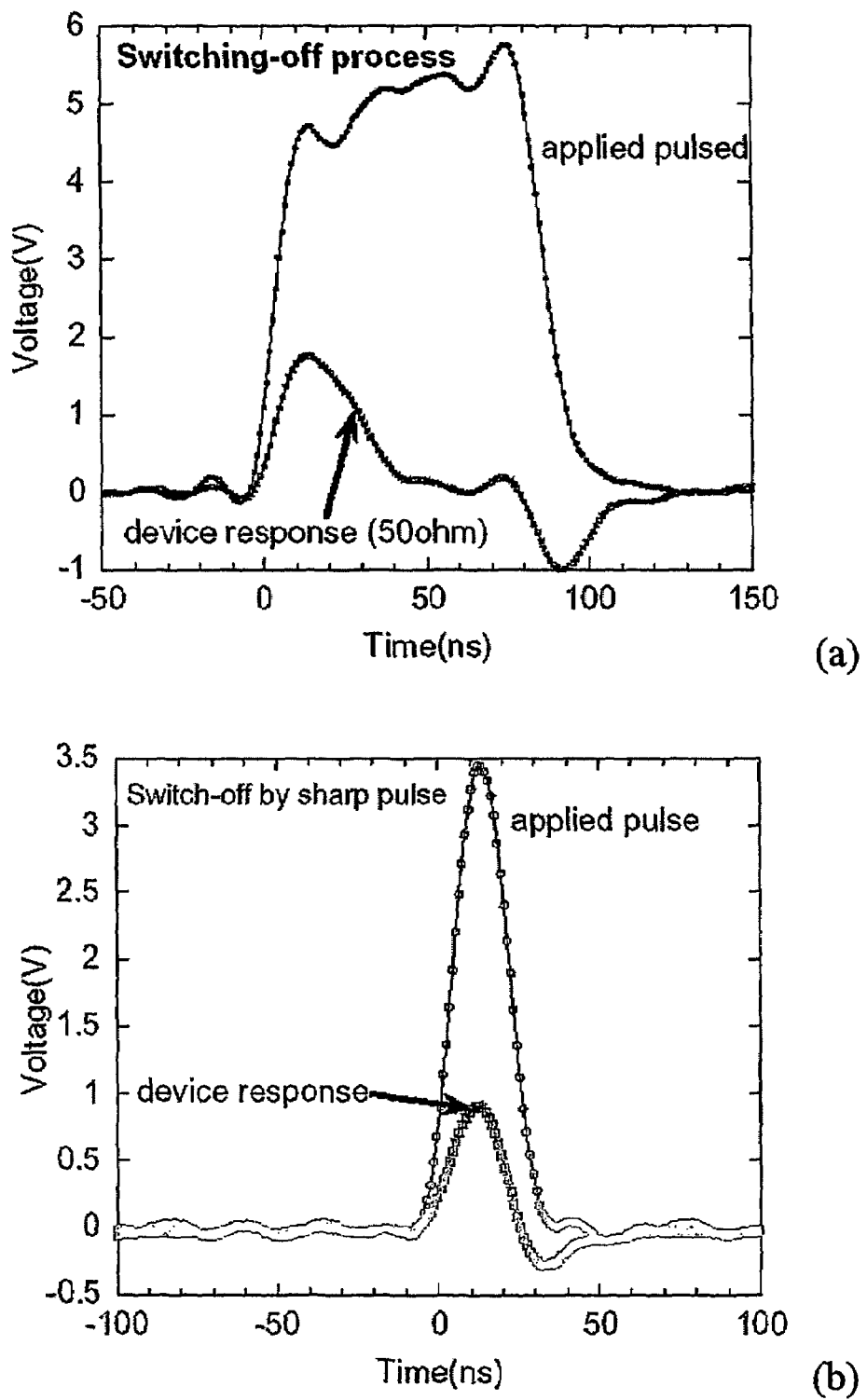
FIG. 7(a) is a graph of the transition speed of an exemplary Cu-OBD from the low resistance state to the high resistance state. The "applied pulsed" curve represents the applied voltage pulse. The "device response" curve stands for the device response from On-state to Off-state by a 50 Ohm read resistor. The two current peaks are caused by the capacitor effect (charging and discharging) of the off-state device.
FIG. 7(b) is a graph of the dynamic response of an exemplary Cu-OBD (initially at On-state) to an applied sharp voltage pulse (3.5 V peak 20 ns half-height width). The response of the Cu-OBD was measured using 50 Ohm read resistor. The negative peak indicates that the device already changed to the off state. The transition process is so fast that it could not be recognized by our current measurement systems.

The transition speed from the On-to-Off state of the Cu-OBDs was shown to be quite fast. It is less than 10 ns, which is within the limitation of our measurement system. By applying a relatively high voltage pulse (about 3 volts) to the device, the device can change its state from low resistance to high resistance in less than nanoseconds. FIG. 7(a) shows the transient response of an exemplary Cu-OBD (initially at the low resistance state) to an applied voltage pulse. Before doing this transition speed measurement, DC I-V curve measurements were taken to make sure the device was initially at the low resistance state. The transition speed from low resistance state to high resistance state is less than nanoseconds. Therefore, a narrow voltage pulse can be used to excite the devices from the on state to the off state. FIG. 7(b) shows the dynamic response of Cu-OBDs (initially at On-state) to a very sharp voltage pulse.

Figure 8:
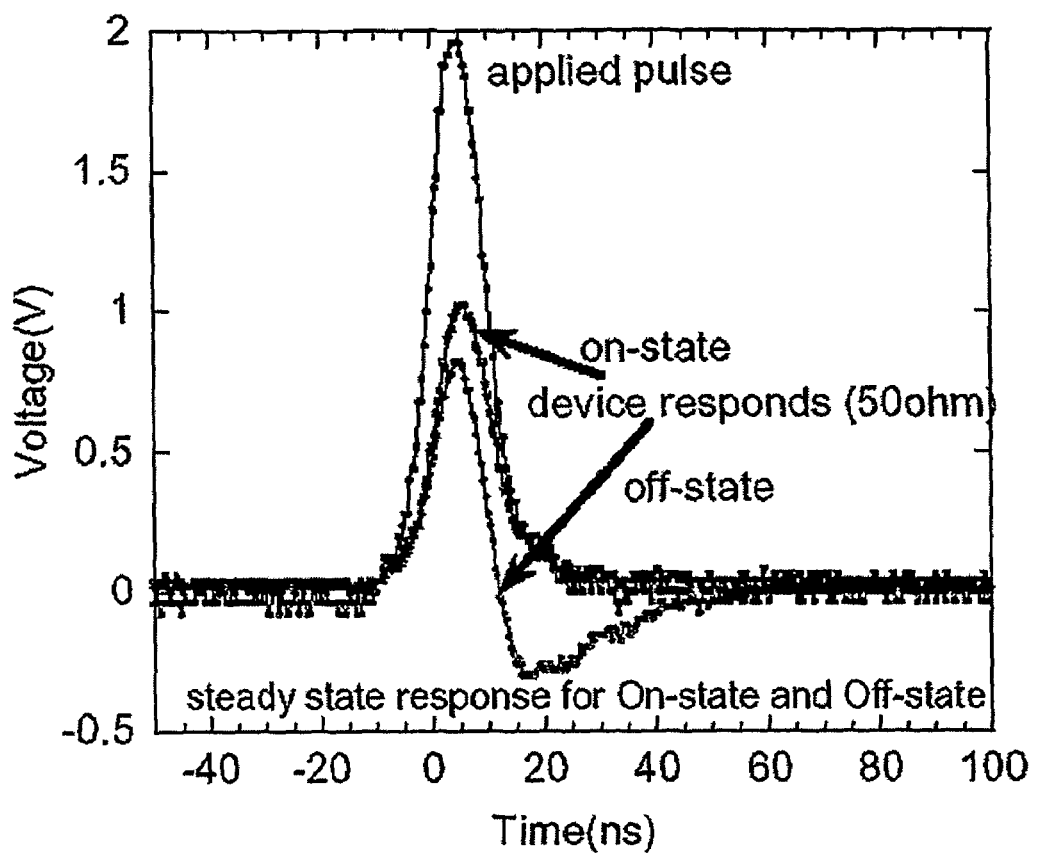
FIG. 8 is a graph of the transient response of both the On-state and Off-state of an exemplary Cu-OBD. The On-state response follows the applied pulse shape, while the Off-state shows a discharging effect which can be used to determine the device status.

The transient response of On-state and Off-state of Cu-OBDs to a very sharp applied voltage pulse is quite different as shown in FIG. 8. It can be seen from FIG. 8 that the current response of the On-state device follows the applied voltage pulse very well, while a negative peak can be seen clearly in the Off-state device response. This is the capacitor discharging effect of the Off-state devices. Therefore, very short voltage pulses (less than 20 ns) can be used for reading. The reading time of a typical Cu-OBD can be less than 20 ns. By further decreasing the device area, the speed of the device will be much faster as the capacitance of the device decreases.

Figure 9:
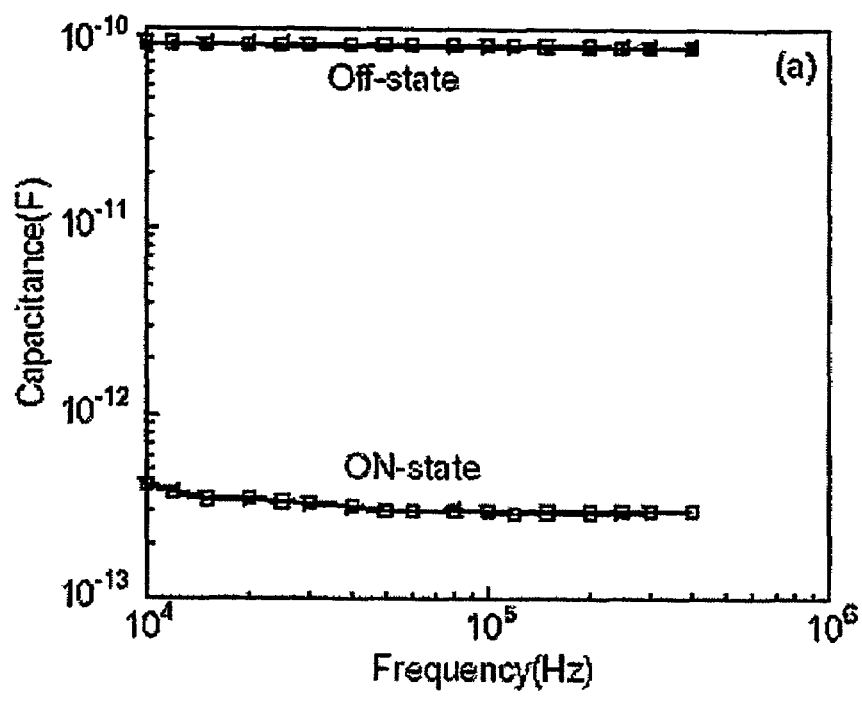
FIG. 9(a) is a graph of the frequency dependence of capacitance of an exemplary Cu-OBD in the On-and-Off states.
FIG. 9(b) is a graph of the frequency dependence of the phase angle of impedance of an exemplary Cu-OBD in the On-and-Off states.
Figure 9:
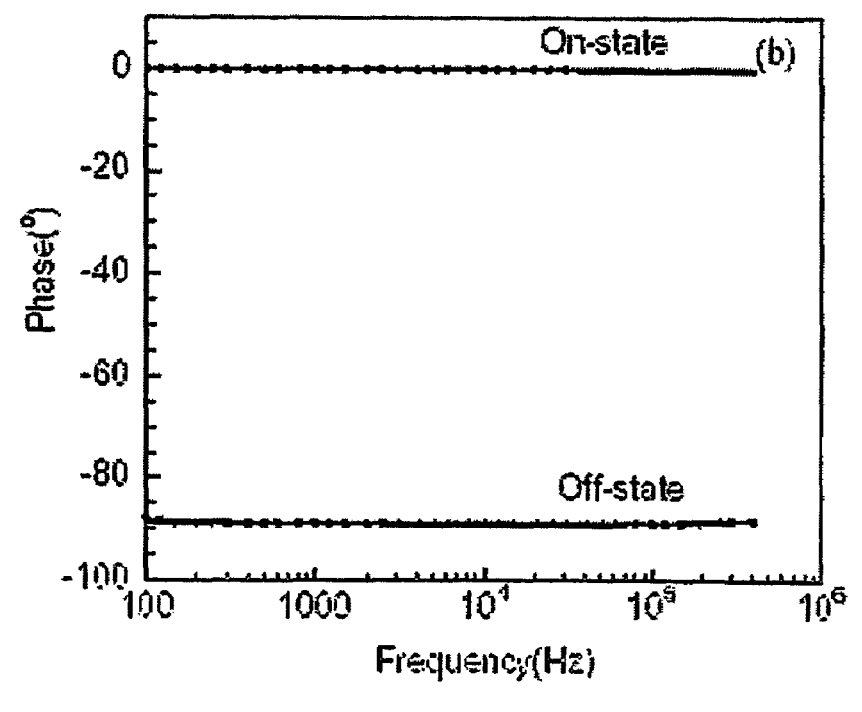

Impedance measurements were carried out using an HP 4284A LCR meter. The frequency dependence of the device's capacitance is shown in FIG. 9(a). If can be seen from FIG. 9(a) that the Off-state devices' capacitance is about 100 pF, while the On-state devices' capacitance is about 0.3 pF. The capacitance decreased more than 2 orders in magnitude after the device was switched from Off-state to On-state.

Figure 10:
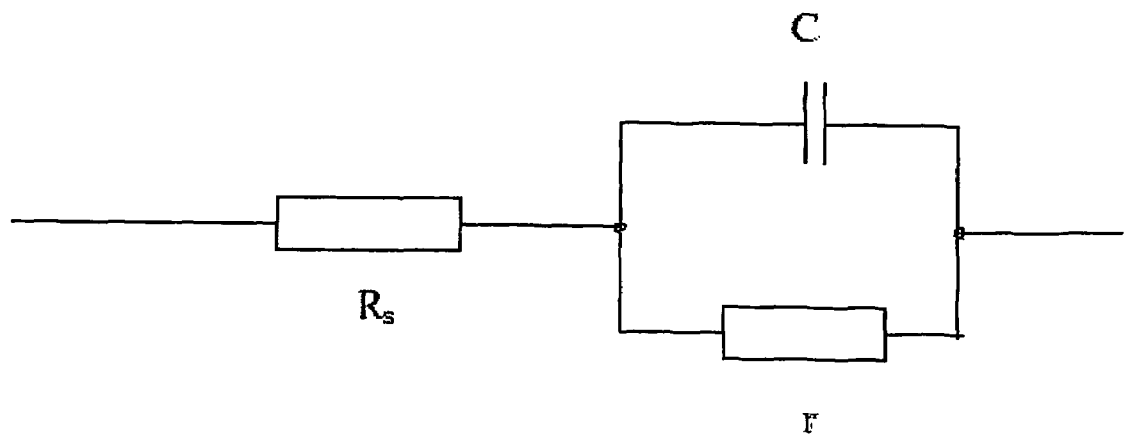
FIG. 10 is a schematic diagram of the circuit model used for calculating the devices' capacitance. The capacitance of the measurement system is less than 0.01 pF and is therefore omitted.

The phase of the impedance for Cu-OBD at both the On-state and the Off-state are shown in FIG. 9(b). It can be seen from FIG. 9(b) that the phase is nearly zero for the device in the On-state indicating a pure resistor case. The phase for the device at the Off-state is nearly $-90°$, indicating a pure capacitor case. The capacitance data shown in FIG. 9(a) is directly measured by a CPCR mode of the LCR meter. To confirm this data, frequency-dependence impedance data were also measured, from which capacitance can be calculated by a circuit model shown in FIG. 10. The impedance of this circuit is $$Z = Rs + \frac{r}{1+r^2\omega^2c^2} - i\frac{\omega c r^2}{1+r^2\omega^2c^2}. \quad (1)$$

When $1/(\omega c) \gg r$, for Cu-OBDs at On-state case, $$Z = R + \frac{r}{1+r^2\omega^2c^2} - ir^2\omega c. \quad (2)$$

Therefore, for On-state Cu-OBDs, the imaginary part of impedance is proportional to the frequency f (Hz):

$$Z_o \sin(\theta) = -2\pi r^2 cf. \quad (3)$$

Here, $Z_o$ is the amplitude of impedance.

When $1/(\omega c) << r$, for the Off-state of Cu-OBD case, the imaginary part of impedance is proportional to $1/f$, $$Z_o \sin(\theta) = -1/(2\pi cf). \quad (4)$$

Figure 11:
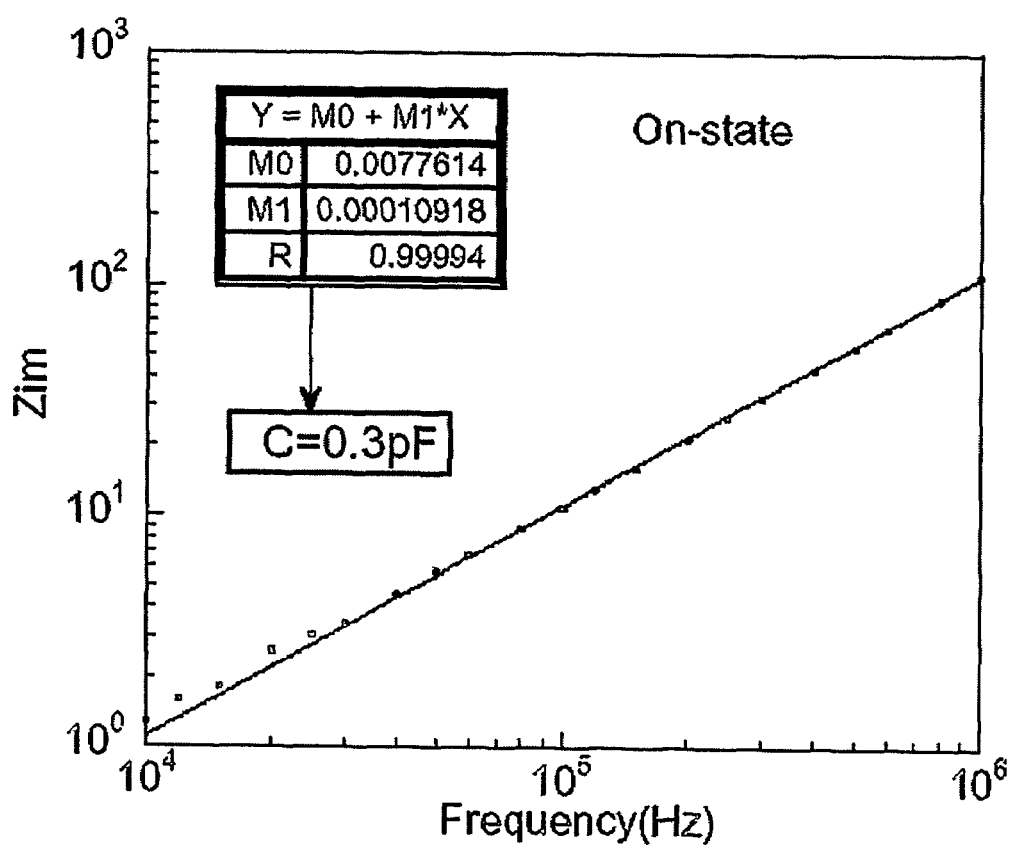
FIG. 11 is a graph of the frequency-dependence of the imaginary part of the impedance for the On-state of an exemplary Cu-OBD. The line in the graph is the fitting results using formula (3) to fit the experimental data. The device's capacitance was determined to be about 0.3 pF which is the same as the direct measurement shown in FIG. 9(a).

FIG. 11 shows the frequency-dependence of the imaginary part of the impedance of the On-state CU-OBD. Using formula (3) to fit the experimental data, the device's capacitance was determined to be about 0.3 pF.

Figure 12:
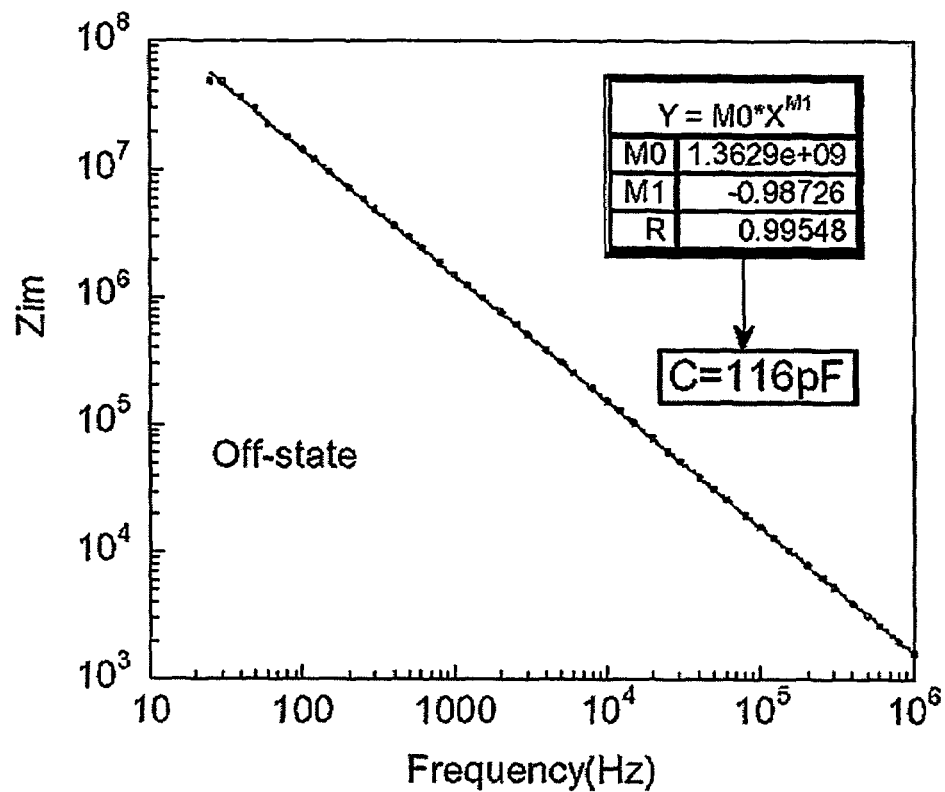
FIG. 12 is a graph of the frequency-dependence of the imaginary part of the impedance for the Off-state of an exemplary Cu-OBD. The line in the graph is the fitting results using formula (4) to fit the experimental data. The device's capacitance was determined to be about 116 pF which is the same as the direct measurement shown in FIG. 9(a).

Using formula (4) to fit the imaginary part of impedance for Off-state Cu-OBD, the Off-state capacitance of the device can be obtained. FIG. 12 shows the frequency-dependence of the imaginary part of the impedance of the Off-state Cu-OBD. The device's capacitance was determined to be about 116 pF which is the same as the direct measurement shown in FIG. 9(a).

Figure 13:
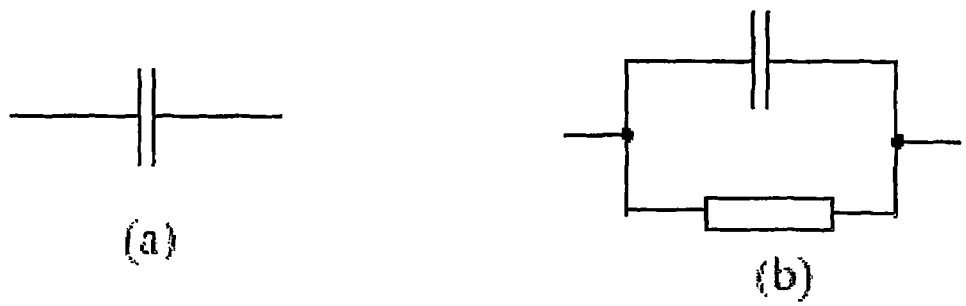
FIG. 13(a) is a schematic diagram of an equivalent circuit for the off-state exemplary Cu-OBD (pure capacitor model).
FIG. 13(b) is a schematic diagram of an equivalent circuit for the on-state exemplary Cu-OBD from conducting filament formation. The resistor in FIG. 13(b) is the filament's resistance.

It apparent from the above that an Off-state Cu-OBD behaves as a pure capacitor. If the On-state of Cu-OBDs is caused by conducting filament formation, the area of the filaments should be much smaller than the device's area. Generally the diameter of the filaments is in the micrometer range and has a certain resistance. Therefore, the formation of conducting filaments in the device should not change the capacitance of the device. Instead, it is equivalent to a resistor that is parallel connected to the device's capacitance. FIG. 13 shows the equivalent circuit of the On-state from a conducting filament formation point of view.

Figure 14:
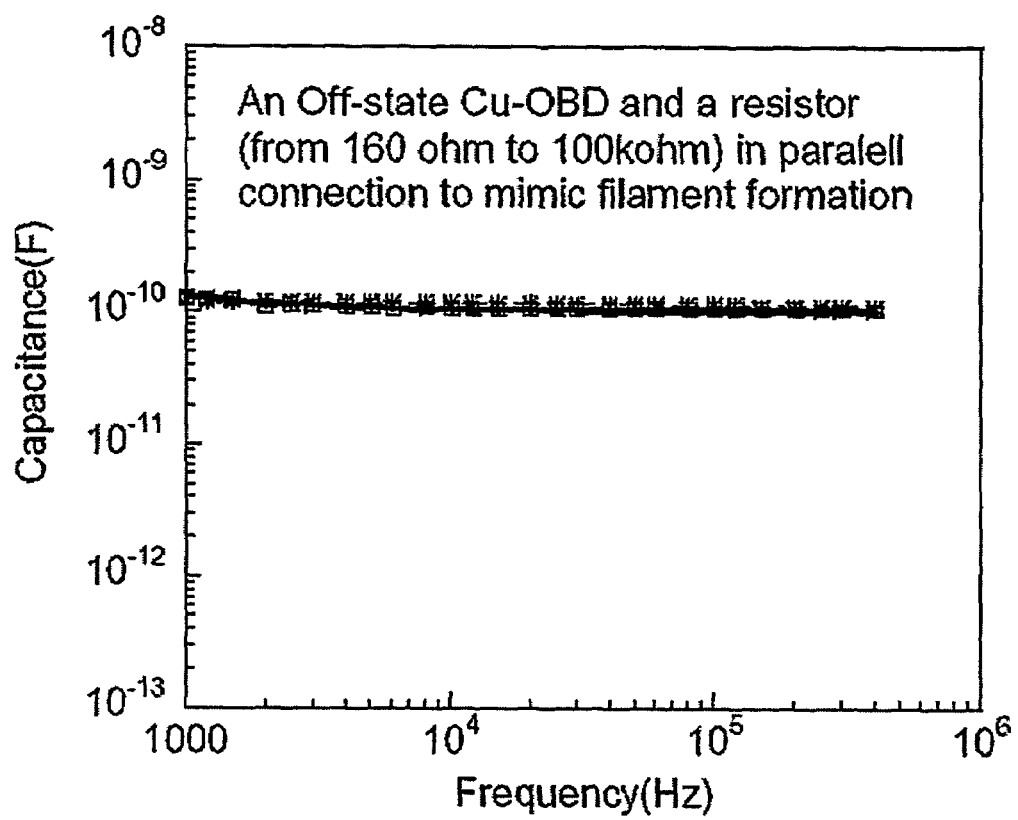
FIG. 14 is a graph of the frequency-dependence capacitance of an Off-state exemplary Cu-OBD with a resistor (mimics conducting filaments) parallel connected to the Cu-OBD. The capacitances with different values of parallel-connected resistors are the same as single Off-state Cu-OBD's (about 100 pF). This demonstrates the On-state of the exemplary Cu-OBD is not a result of filament formation.
Figure 15:
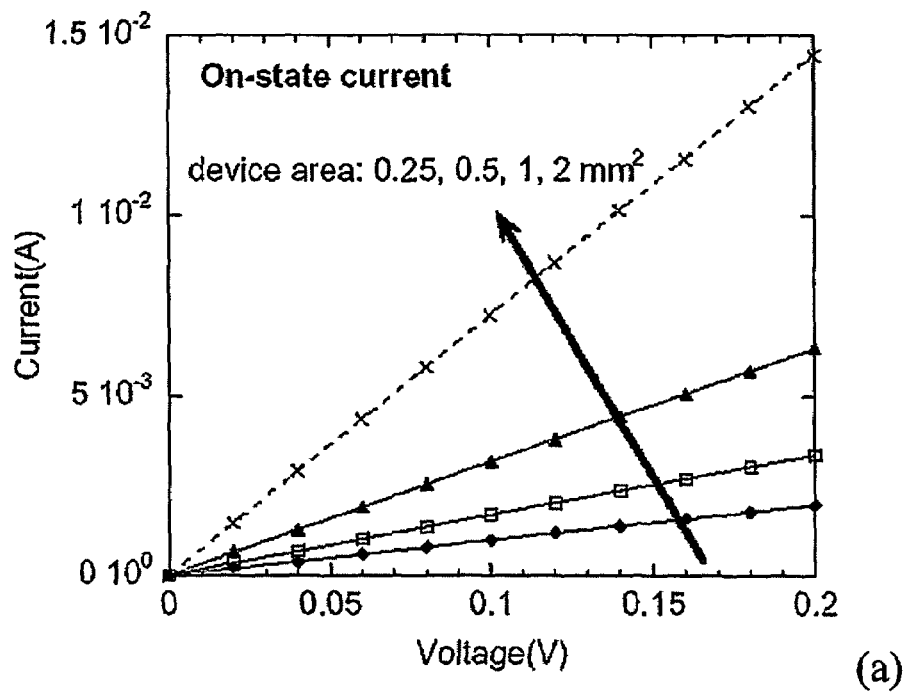
FIG. 15(a) is a graph of the on-state I-V characteristics for an exemplary Cu-OBD with various active layer areas. The bold arrow represents an increase in area. The "+" line is 2 mm$^2$; the "solid triangle" line is 1 mm$^2$; the "open square" line is 0.5 mm$^2$; and the "solid square" line is 0.25 mm$^2$.
FIG. 15(b) is a graph of the area-dependence of the on-state current at 0.2 V bias.
Figure 15:
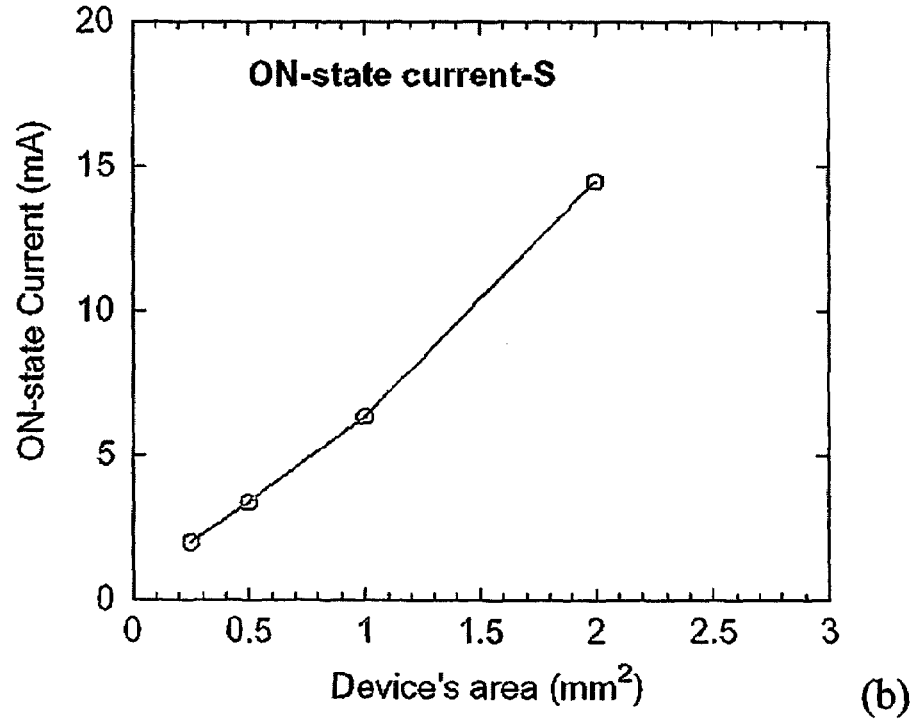

A resistor was parallel connected to an Off-state Cu-OBD, by changing the resistance of the resistor from 160 Ohm to 100 kOhm to mimic the possible resistance of the conducting filament. The capacitance of the device was then measured. As expected, the paralleled resistor (the formation of conducting filament) doesn't change the capacitance of the device. FIG. 14 shows the frequency-dependence capacitance of an Off-state Cu-OBD with a resistor parallel connected to it. The capacitances with different values of parallel-connected resistors are the same as single Off-state Cu-OBDs (about 100 pF). As shown in FIG. 9(a) and FIG. 11, the capacitance of the On-state Cu-OBD is much smaller than the Off-state Cu-OBD (more than two orders). Therefore, the section of conducting path for On-state device is the same as the device's area. This would not be the case for filament formation for On-state Cu-OBDs. Generally, the On-state current has little, if any, relation with the device's area if conducting filament formation is involved. The On-state I-V characteristics for Cu-OBDs with various devices' area are shown in FIG. 15(a). The area-dependent of On-state current at 0.2 V bias is shown in FIG. 15(b). The On-state current at the same bias is nearly proportional to the devices' surface area.

Figure 16:
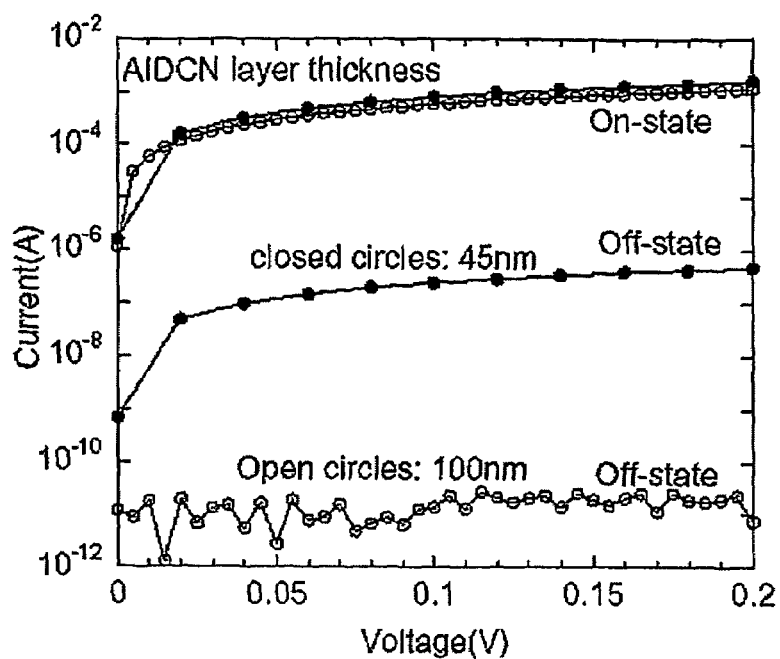
FIG. 16 is graph of the I-V characteristics of two exemplary Cu-OBD's with the same LiF layer thickness (2.5 nm), but different organic-layer thickness (45 nm, closed circles, and 100 nm, open circles, respectively). The On/Off ratios for the thicker and thinner devices are $10^8$ and $10^3$, respectively.

The On/Off ratio is an important factor for device's application. The Off-state current of the devices may not be low enough. Therefore, determining how to decrease the leakage current and increase the On/Off ration is very important. By changing the thickness of the buffer layer (LiF) and the organic layer (AIDCN). It was found that about 2.5 nm for LiF layer and about 100 nm for the AIDCN layer is the preferred condition to obtain the highest On/Off ratio. Up to now, a $10^8$ On/Off ratio has been achieved for Cu-OBDs. By decreasing the thickness of the organic layer, the Off-state current will go up, leading to a decrease in the On/Off ratio. FIG. 16 shows the I-V characteristics of two Cu-OBDs with the same LiF layer thickness (2.5 nm) but different Organic layer thickness (45 and 100 nm respectively). The opened circles represent the data for the Cu-OBD with a thicker AIDCN layer (100 nm). For this device, the On/Off ration can reach as high as $10^8$. In fact, the Off-state current is within the limitation of the measurement system. The closed circles stand for the data for the Cu-OBD with a thinner AIDCN layer (45 nm). For this device, the On-state current is a little higher, but the Off-state current is much larger than the thicker one. The On/Off ratio for the Cu-OBD with 45 nm-thickness AIDCN layer is just above $10^3$.

Figure 17:
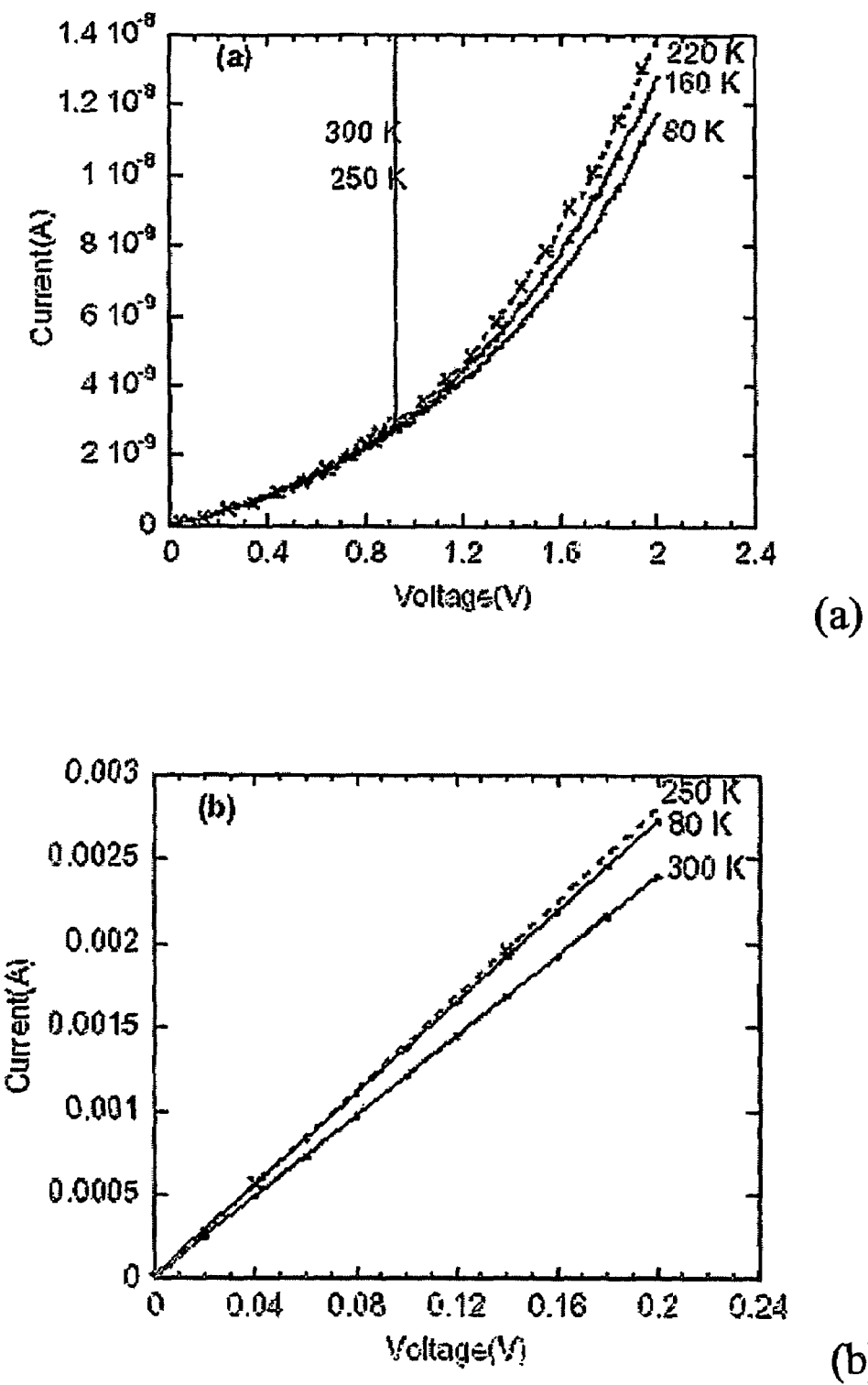
FIG. 17(a) is a graph of the I-V behavior of an exemplary Cu-OBD at 80, 160, 220, 250 and 300° K. When the temperature below 250 K the device exhibit non-linear I-V characteristics. Below the switching bias voltage (about 0.92 V), the none-linear I-V curves at the different temperature overlap. The switching voltage is the same at 250 and 300 K.
FIG. 17(b) is a graph of the On-state I-V curves of an exemplary Cu-OBD at 80, 250 and 300 K. The measurement sequence is, first 300° K, then cool down to 80 K, then heating to 250 K.

To investigate the low temperature behavior of the exemplary Cu-OBD's, a PDF-475 dewar was used to study the I-V behavior from 80° K to 300° K. It was found that below 250° K, the devices are difficult to be triggered from the Off-state to the On-state. FIG. 17(a) shows the I-V behavior of a Cu-OBD at 80, 160, 220, 250 and 300° K. When the temperature below 250° K, the device exhibits non-linear I-V behavior. Below the switching bias voltage (about 0.92 V), the nonelinear I-V curves at the different temperature overlapped. At temperature above 250° K the devices can be switched between On-Off states. The switching voltage is the same at 250 and 300° K The On-state I-V curves at 80, 250 and 300° K are shown in FIG. 17(b). First the On-state I-V curve at 300° K was measured, then the device was cooled down to 80° K, where the device remained in the On-state. After measuring the On-state I-V characteristics at 80° K, the device was switched to the Off-state by applying a 4V voltage pulse. After being heated to 250° K, the device again was switched to the On-state by applying a voltage pulse (1V). Then the On-state I-V characteristics at 250° K were measured. It can be seen from FIG. 17(b) that there is some thermal hysteretic behavior. The On-state of CU-OBDs has a linear I-V relation, indicating that the charge transport in the On-state of the Cu-OBD is not a hopping process. Although the Off-state I-V characteristics are non-linear, they are weakly temperature-dependent. Before a switch-on voltage is applied, the non-linear I-V behavior is temperature-independent. At 2 V bias, the Off-state current increases only about 15% when the temperature of the device increased from 80 to 220° K If charge transport is a thermal hopping process, then the activation energy, $E_a$ ($I=I_o \exp(-E_a/(kT))$) is calculated to be 1.6 meV, which is quite small, even compared with 80 K (6.9 meV).

Figure 18:
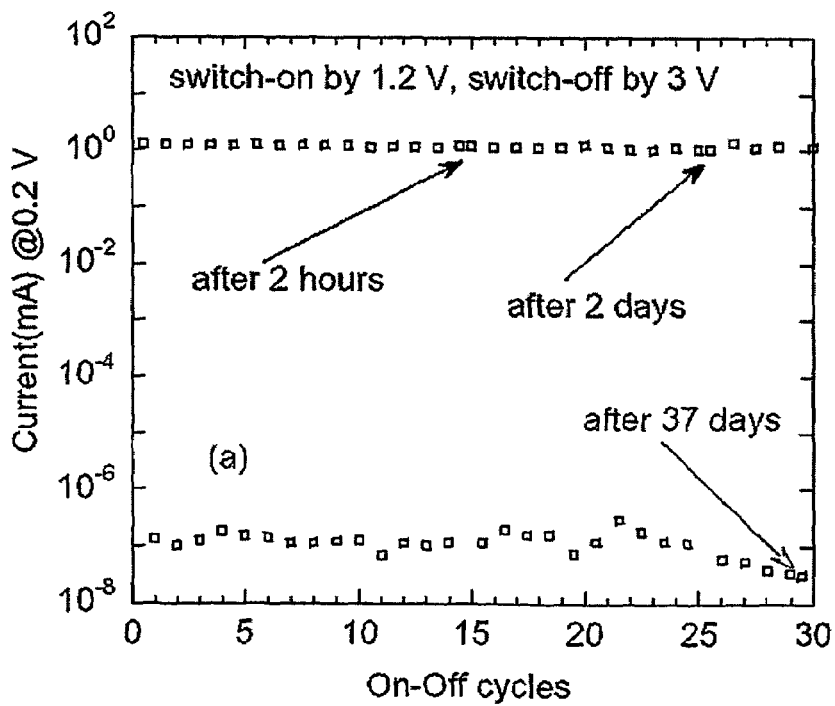
FIG. 18 is a graph of the cycles test for an exemplary Cu-OBD. At first, the device was in the On-state. An erase voltage pulse was applied so that the device changed to Off-state. The data shown graphically depicts a number cycles between On-and-Off states with the current measured at 0.2 V bias. The stability of the On-state was tested by leaving the device alone for increasing amounts of time (such as 2 hours, 2 days) without any bias, and then measuring current through the device. The device still remained at the On-state as shown in FIG. 18. The On-state can be erased to the Off-state for continued cycles test. The Off-state of the exemplary Cu-OBD was also stable.

The exemplary Cu-OBD's that were prepared were found to be non-volatile rewritable memory devices. Once a Cu-OBD is switched to either state, it remains at that state without any bias applied for a long time (more than months). In write-read-erase-read (WRER) cycles test, a 3 V voltage pulse was used for erase, a 1.2 V voltage pulse for write, and a 0.2 V voltage bias for reading. FIG. 18 shows the cycles test for an exemplary Cu-OBD. It should be noted that this cycles test is not a time-dependent dynamic cycles test. The real-time dynamic cycles test will be set forth below. At first, the device was in the On-state with an erase voltage pulse being applied to change the device to the Off-state. The data shown on FIG. 18 is cycle-number dependent On-and-Off states current at 0.2 V. The stability of the On-state was tested by leaving it alone for some time (such as 2 hours, 2 days) without any bias, then measuring it again. It still remained at the On-state as shown in FIG. 18. The On-state certainly can be erased to the Off-state for continued cycles test. The Off-state of Cu-OBDs is also stable. When the device was switched to the Off-state and kept in vacuum chamber for 37 days, it was still at the Off-state and could be switched to the On-state for further continuous cycles testing (see the last three dots at the right side of FIG. 18).

Figure 19:
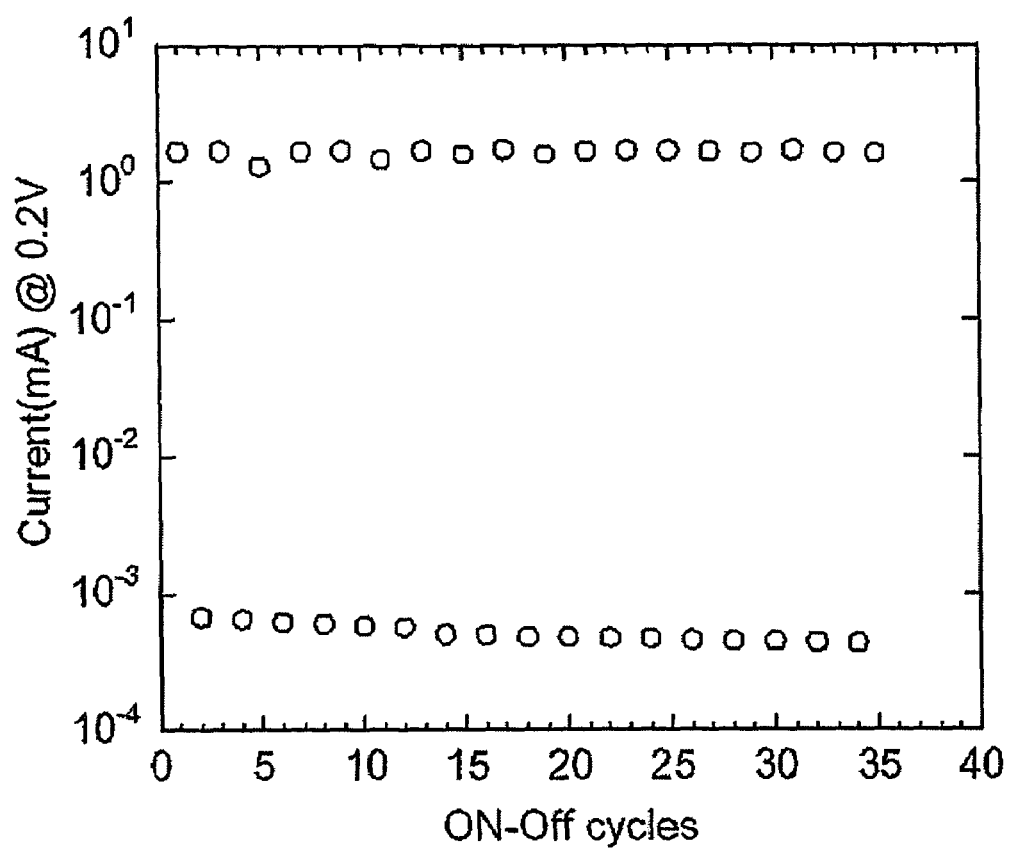
FIG. 19 is a graph of the cycles test for an exemplary Cu-OBD (Cu/LiF(2.5 nm)/AIDCN(45 nm)/Cu). A 3V voltage pulse was used for "switch-off" and a 1.2 V voltage pulse was used for "switch-on". The current was read at 0.2 V bias.

FIG. 19 shows another Cu-OBD (Cu/LiF(2.5 nm)/AIDCN (45 nm)/Cu) cycles test. 3V was used for erase, 1.2 V for write, and the current was read at 0.2 V bias. It can be seen from FIG. 19 that the On-state current is nearly the same during the cycles test, but the Off-state current shows decreasing tendency during cycles test.

Figure 20:
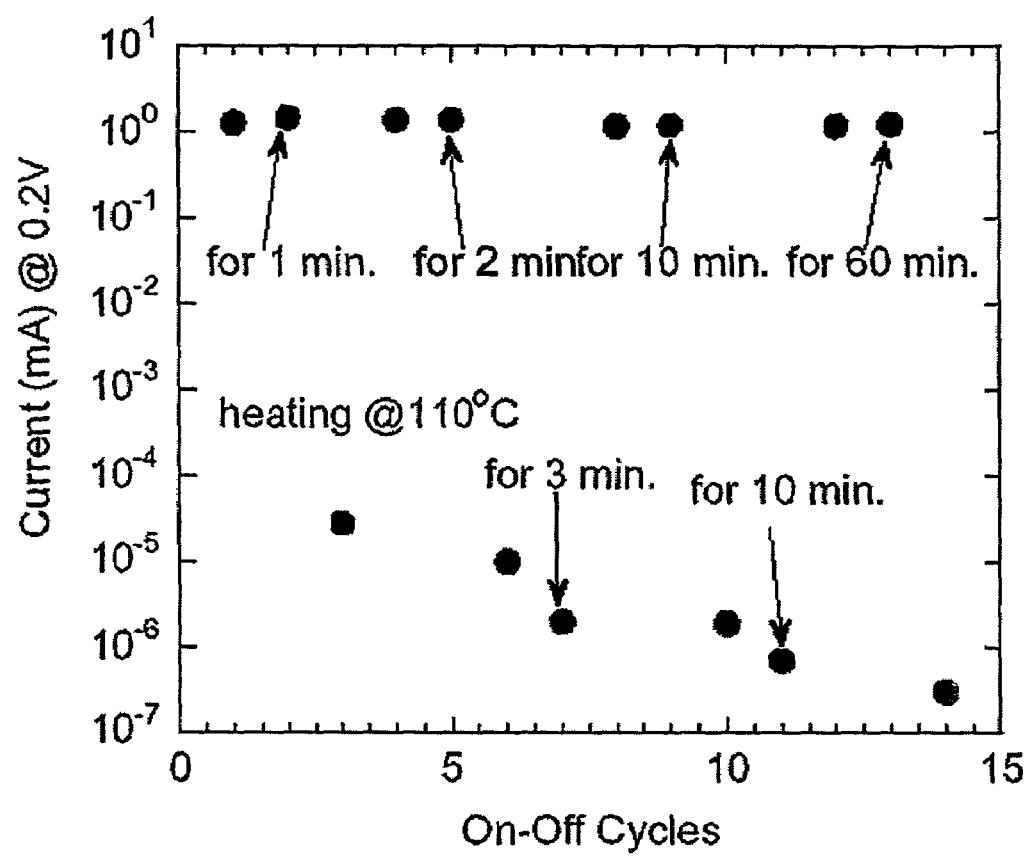
FIG. 20 is a graph of the heating-treatment and cycles test for an exemplary Cu-OBD. The Off-state current decreases (about 2 orders in magnitude) after heating treatment. The heating treatment has no effect on the On-state current of the device. This heating effect of the Off-state current can only be observed for devices with relatively thinner AIDCN layers in which the Off-state current is relatively high. This is another method for decreasing the Off-state current of Cu-OBD's.

The above stability tests were performed at room temperature. A further demonstration of the properties of devices in accordance with the present invention involved heating the device and checking the device's state (On, or Off state) before and after heating treatment. FIG. 20 shows the heating-treatment and cycles test. First, the device was at On-state, as shown by the first dot in FIG. 20, then it was heated to 110° C. for 1 minute. After this heating treatment, it was still at the On-state as shown by the second dot in FIG. 20. Then, a 3 V voltage pulse was applied to restore it to the Off-state. The third dot in FIG. 20 shows that the device was successfully restored to the Off-state that was then switched to On-state again by applying a 1.2 V voltage pulse as confirmed by the fourth dot in FIG. 20. The device was heated again at 110° C. for 2 minutes, 10 minutes, and even 1 hour. The On-state still remained and could be restored to the Off-state after applying an erase voltage pulse. The stability of Off-state of Cu-OBDs is also stable during and after heating treatment as indicated by dot Nos. 6-7 and 10-11.

It can be seen from FIG. 20 that the Off-state current decreases substantially (about 2 order in magnitude) after heating treatment, while heating treatment has no effect on the On-state current of the device. This Heating effect of the Off-state current can only be observed for devices with relatively thinner AIDCN layer in which the Off-state current is relatively high. This is another method for decreasing the Off-state current of Cu-OBD's.

Figure 21:
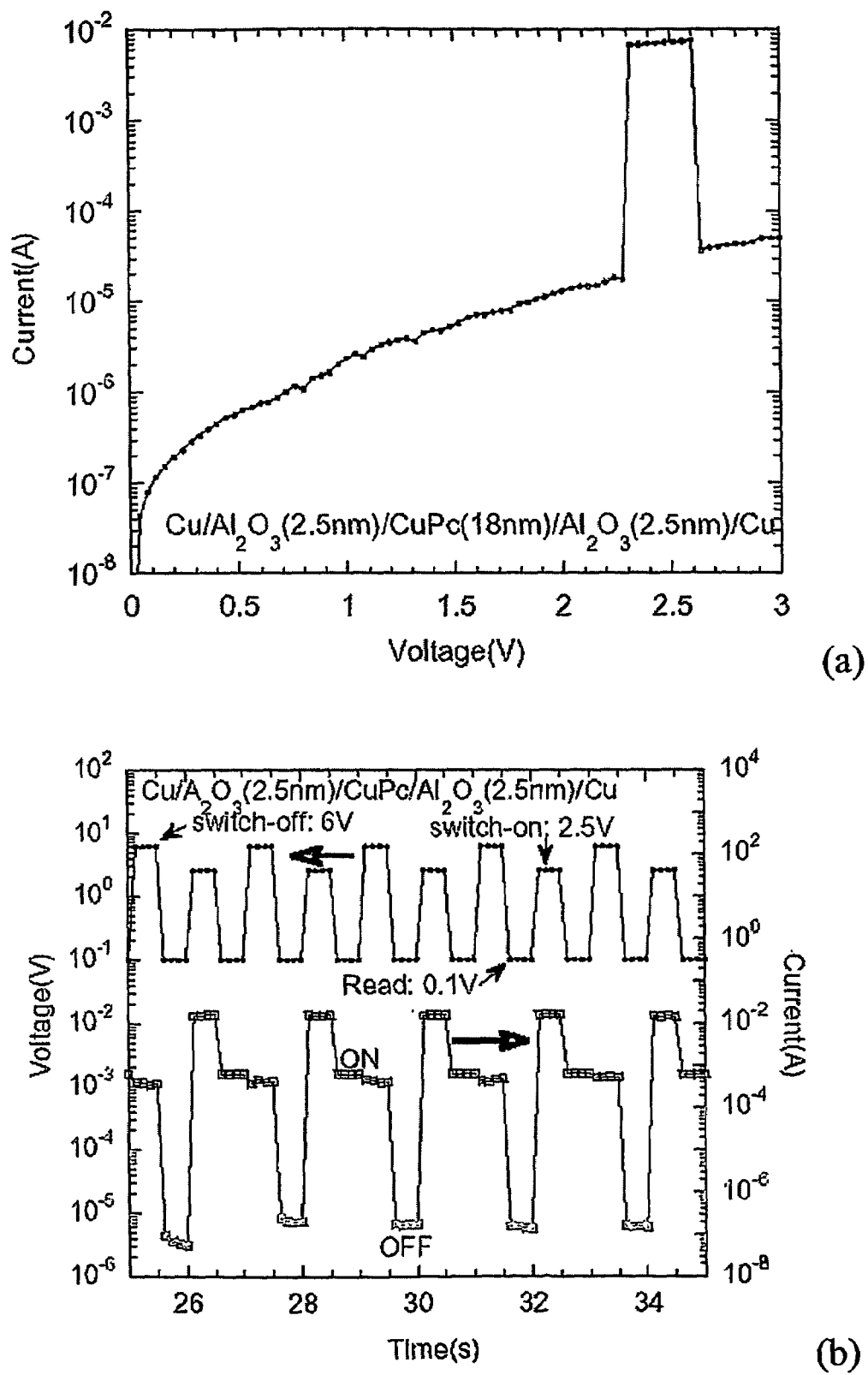
FIG. 21 (a) is a graph of the I-V characteristics of an exemplary Cu-OBD for write-read-erase real time dynamic cycles test.

A Keithley 2400 was used to apply programmable voltage pulses in order to conduct WRER cycles tests. The typical WRER cycles cell are shown in FIGS. 21(a) and (b). FIG. 21(a) is the I-V characteristics for the cycles-test Cu-OBD. FIG. 21(b) is the real time dynamic cycles test.

Figure 22:
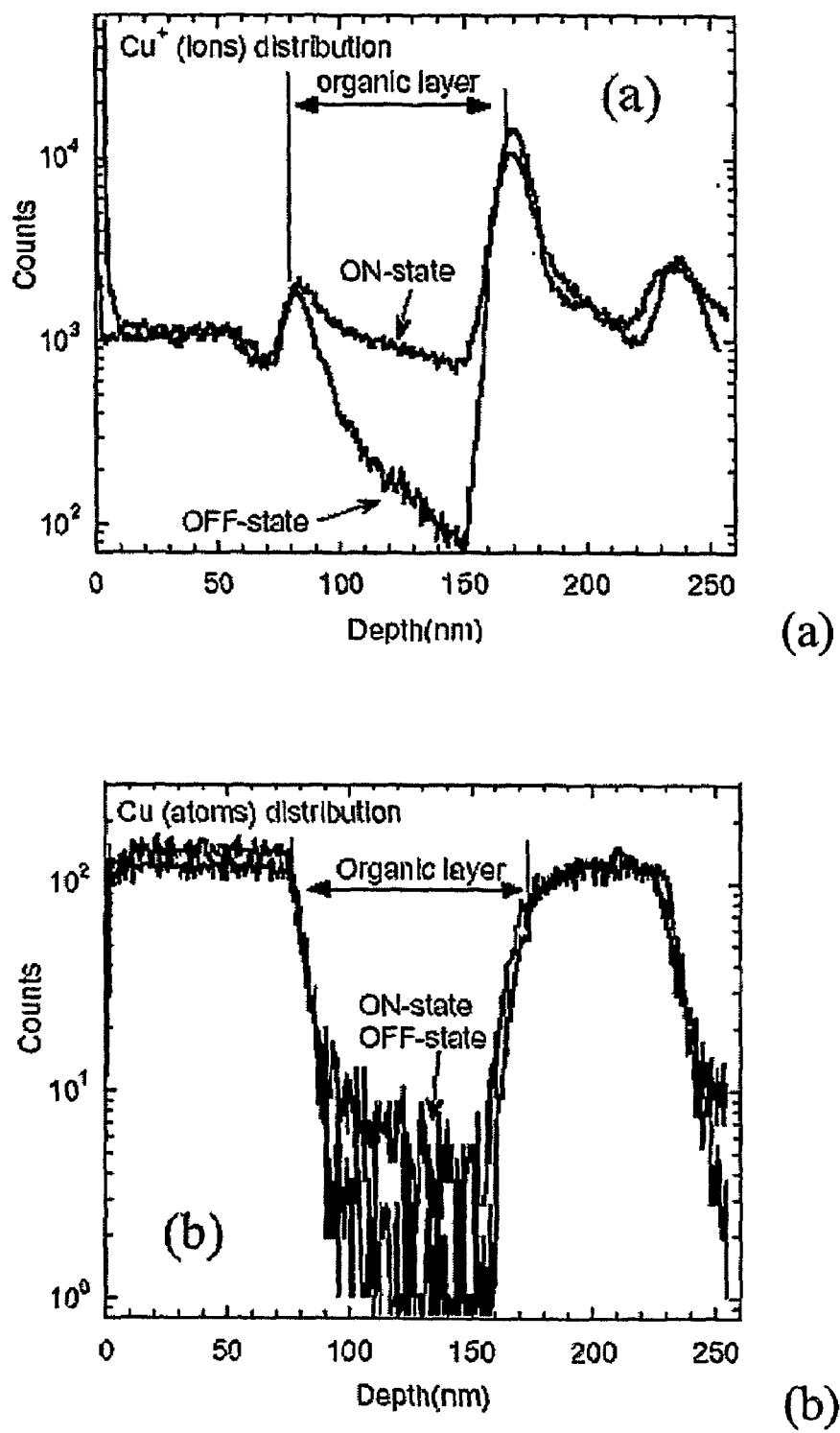
FIG. 22(a) is a SIMS Cu$^+$ depth profile of an exemplary Cu-OBD.
FIG. 22(b) is a SIMS Cu depth profile of an exemplary Cu-OBD. The On-state is caused by high Cu$^+$ concentration within the organic layer.

It is believed that in accordance with the present invention, the On-state and Off-states are due to the $Cu^+$ distribution and subsequent metallization and de-metallization or the organic layer as controlled by the buffer layer. This belief is supported by the secondary ion mass spectrometry (SIMS) depth profile measurement for $Cu^+$ ion and Cu atom in exemplary devices in both states. It was found that $Cu^+$ ion are driven into the organic layer in the On-state (metallization process), while $Cu^+$ ions drifted out of the organic layer in the Off-state as shown in FIG. 22(a) (de-metallization process). Therefore, the ON-and-OFF states can be switched back and forth by controlling the $Cu^+$ ion distribution profile within the organic layer. The atomic Cu distribution in the Cu-OBDs (FIG. 22(b)) was found to be low within the organic layer for both of the states. Accordingly, the dynamic $Cu^+$ concentration within the organic layer is believed to be responsible for the observed bistability of Cu-OBDs.

Having thus described exemplary embodiments of the present invention, it should be noted by those skilled in the art that the within disclosures are exemplary only and that various other alternatives, adaptations and modifications may be made within the scope of the present invention. The buffer layers (nanosurfaces) of the present invention may be used in a wide variety of bistable devices as an interface between the electrode and the organic bistable layer. For example, the active layer of the present OBD's (organic layer plus one or more buffer layers) may be used to replace the bistable bodies in devices of the type described in PCT Application No. US01/17206. Accordingly, the present invention is not limited to the above preferred embodiments and examples, but is only limited by the following claims.

BIBLIOGRAPHY

1. J. F. Dewald, A. D. Pearson, W. R. Northover, and W. F. Peck, Jr., J. Electrochem. Soc., 109, 243c (1962). "Semiconducting glasses"
2. Ovshinsky, S. R. Localized states in the gap of amorphous semiconductors. Phys. Rev. Lett., vol. 36 (no. 24), 14 Jun. 1976, p. 1469-72.
3. Yu, G. Kriger, N. F. Yudanov, I. K., Igumenov, and S. B. Vashchenko, J. Struct. Chem., 34 (1993). "Study of test structures of a molecular memory element"
4. H. J. Hovel and J. J. Urgell, J. Appl. Phys. 42, 5076 (1971). "Switching and memory characteristics of ZnSe—Ge heterojunctions"
5. R. Kumai, Y. Olimoto and Y. Tokura, Science, 284, 1645 (1999). "Current-induced insulator-metal transition and pattern formation in an organic charge-transfer complex".
6. R. S. Potember, T. O. Poehler and D. O. Cowan, Appl. Phys. Lett. 34, 407 (1979). "Electrical switching and memory phenomena in Cu-TCNQ thin films"
7. F. Garnier, R. Hajlaoui, A. Yassar, and P. Shirakawa, Science 265, 1684 (1994)
8. F. Hide, M. A. Diaz-Garcia, B. J. Schwartz, M. R. A. Andersson, Q. Pei, and A. J. Heeger, Science 273, 1883 (1997).
9. R. Kumai, Y. Okimoto, Y. Tokura, Science 284, 1645 (1999).
10. W. Fujita, and K. Awaga, Science 286, 261 (1999).
11. J. H. Burroughes, D. D. C. Bradley, A. R. Brown, R. N. Marks, K. Mackay, R. H. Friend, P. L. Burn, and A. B. Holmes, Nature, 347, 539 (1990).
12. T. Yamada, D. Zou, H. Jeong, Y. Akaki, and T. Tsutsui, Synthetic Metals, 111-112, 237 (2000).
13. J. Liu, Y. Shi, L. P. Ma, and Y. Yang, J. Appl. Phys. 88, 605 (2000).
14. Y. Hamada, C. Adachi, T. Tsutsui, S. Saito, Jpn. J. Appl. Phys. 31, 1812 (1992).
15. Y. Yang et al., U.S. Pat. No. 5,563,424, Oct. 8, 1996.
16. McBrayer, J. D., Swanson, R. M., and Sigmon, T. W., Diffusion of metals in silicon dioxide. J. Electrochem. Soc. 133, 1242(1986).
17. Rosenberg, R., Edelstein, D. C., Hu, C. K., Rodbell, K. P., Copper metallization for high performance silicon technology, Annual Rev. Materials Science, 30, 229 (2000). Kaloyeros, A. E., Eisenbraun, E., Ultrathin diffusion barriers/liners for gigascale copper metallization, Annual Rev. Materials Science, 30, 363(2000).
18. W. D. Brown, J. E. Brewer, Nonvolatile semiconductor memory technology, IEEE Press, New York, (1998).
19. Ma, L. P., Pyo, S. M., Xu, Q. F. and Yang, Y., Nonvolatile electrical bistability of organic/metal-nanocluster/organic system, Appl. Phys. Lett. 82, 1419(2003), Ma, L. P., Liu, J, and Yang, Y., organic electrical bistable devices and rewritable memory cells, Appl. Phys. Lett. 80, 2997 (2002), Ma, L. P. Liu, J., Pyo, S. M. and Yang, Y., Organic bistable light-emitting devices, Appl. Phys. Lett. 80, 362(2002), Ma, L. P., Liu, J., Pyo, S. M., Xu, Q. F. and Yang, Y., Organic bistable devices, Mol. Cryst. Liq. Cryst. 378, 185 (2002).
20. Nakayama, K., Kojima, K., Imai, Y., Kasai, T., Fukushima, S., Kitagawa, A., Kumeda, M., Kakimoto, Y., Suzuki, M., Nonvolatile memory based on phase change in Se—Sb—Te glass, J. J. Appl. Phys., Part 1, 42 (2A), 404 (2003).

21. Kozicki, M. N. and West, W. C., Programmable metallization cell structure and method of making same, U.S. Pat. No. 5,761,115 (1998).
22. Ostraat, M. L., De Blauwe, J. W., Green, M. L., Bell, L. D., Brongerma, M. L., Casperson, J. R., Flagan, C. and Atwater, H. A., Synthesis and characterization of aerosol silicon nanocrystal nonvolatile floating-gate memory devices, Appl. Phys. Lett. 79, 433(2001).
23. Ma, L. P., Yang, W. J., Xie, S. S. and Pang, S. J., Ultrahigh density data storage from local polymerization by a scanning tunneling microscope, Appl. Phys. Lett. 73, 3303 (1998).
24. Segui, Y., Bui Ai, and Carchano, H., Switching in polystyrene films: Transition from on to off state, J. Appl. Phys. 47, 140(1976).
25. J. Chen, W. Wang, M. A. Reed, A. M. Rawlett, D. W. Price, and J. M. Tour, Room-temperature negative differential resistance in nanoscale molecular junctions, Appl. Phys. Lett. 77, 1224(2000).
26. Beeler, F., Andersen, O. K, and Scheffler, M., Theoretical Evidence for Low-Spin Ground States of Early Interstitial and Late Substitutional 3d Transition-Metal Ions in Silicon, Phys. Rew. Lett. 55, 1498(1985).
27. Istratov, A. A., Weber, E. R, Physics of copper in silicon, J. Electrochemical Society, 149, G21(2002). Istratov, A. A., Flink, C., Hieslmair, H., McHugo, S. A., Weber, E. R., Diffusion, solubility and gettering of copper in silicon, Materials Science. and Engineering Technology B, 72, 99(2000). Lee, K. L., Hu, C. K, Tu, K. N., In-situ scanning electron microscope comparison studies on electromigration of Cu and Cu(Sn) alloys for advanced chip interconnects, J. Appl. Phys. 78, 4428-4437(1995).
28. Loke, A. L. S., Wetzel, J. T., Townsend, P. H., Tanabe, T., Vrtis, R. N., Zussman, M. P., Kumar, D., Ryu, C., Wong, S. S., Kinetics of copper drift in low-kappa polymer interlevel dielectrics, IEEE Transactions on Electron Devices, 46, 2178(1999).
29. Wang, M. T., Lin, Y. C., Chen, M. C., Barrier properties of very thin Ta and TaN layers against copper diffusion, J. Electrochemical Society, 145, 2538(1998). Faltermeier. C., Goldberg, C., Jones, M., Upham, A., Manger, D., Peterson, G., Lau, J., Kaloyeros, A. E., Arkles, B., Paranjpe, A., Barrier properties of titanium nitride films grown by low temperature chemical vapor deposition from titanium tetraiodide, J. Electrochemical Scoiety, 144, 1002(1997). Krishnamoorthy, A., Chanda, K., Murarka, S. P., Ramanath G., Ryan, J. G., Self-assembled near-zero-thickness molecular layers as diffusion barriers for Cu metallization, Appl. Phys. Lett. 78, 2467(2001).
30. Lane, M. W., Liniger, E. G., and Lioyd, J. R., Relationship between interfacial adhesion and electromigration in Cu metallization, J. Appl. Phys. 93, 1417(2003).
31. Istratov, A. A., Flink, C., Hieslmair, H., Weber, E. R., and Heiser, T., Intrinsic diffusion coefficient of interstitial copper in silicon, Phys. Rev. Lett. 81, 1243(1998).
33. Sprang, H. A. van, and Venne, J. L. M. van de, Influence of the surface interaction on threshold values in the cholestericnematic phase transition, J. Appl. Phys. 57, 175 (1985). Boyd, G. D., Cheng, J, and Ngo, P. D. T., liquid-crystal orientational bistability and nematic storage effects, Appl. Phys., Lett. 36, 556(1980), Gruler, H., and Cheung, L., Dielectric alignment in an electrically conducting nematic liquid crystal, J. Appl. Phys. 46, 5097 (1975). Patel, J. S., Room-temperature switching behavior of ferroelectric liquid c2ystals in thin cells, Appl. Phys. Lett. 47, 1277(1985).
33. Yang, K. H., Chieu, T. C., and Osofsky, S., Depolarization field and ionic effects on the bistability of surface-stabilized ferroelectric liquid-crystal devices, Appl. Phys. Lett. 55, 125(1989).

What is claimed is:

1. A bistable electrical device that is convertible between a low resistance state and a high resistance state, said device comprising:
   a first electrode that includes a first electrode surface;
   a layer of low conductivity material having a first surface and a second surface wherein said first surface of said layer of low conductivity material is in electrical contact with said first electrode surface;
   a second electrode that includes a second electrode surface; and
   a buffer layer located between said second electrode surface and the second surface of said layer of low conductivity material,
   wherein said buffer layer is constructed of a material and a form to provide control of metal ion migration from said second electrode to said layer of low conductivity material when a voltage is applied between said first and second electrodes to thereby provide a bistable behavior of said bistable electrical device, and
   wherein said bistable electrical device is convertible between a high electrical resistance state and a low electrical resistance state when a first voltage is applied between said first and second electrodes and said bistable electrical device is convertible between said low electrical resistance state and a high electrical resistance state when a second voltage is applied between said first and second electrodes, said second voltage having a greater magnitude than said first voltage,
   wherein said organic low conductivity material is 2-amino-4,5-imidazoledicarbonitrile.

2. A bistable electrical device that is convertible between a low resistance state and a high resistance state, said device comprising:
   a first electrode that includes a first electrode surface;
   a layer of low conductivity material having a first surface and a second surface wherein said first surface of said layer of low conductivity material is in electrical contact with said first electrode surface;
   a second electrode that includes a second electrode surface;
   a buffer layer located between said second electrode surface and the second surface of said layer of low conductivity material; and
   a diode connected to at least one of said first or second electrodes,
   wherein said buffer layer is constructed of a material and a form to provide control of metal ion migration from said second electrode to said layer of low conductivity material when a voltage is applied between said first and second electrodes to thereby provide a bistable behavior of said bistable electrical device, and
   wherein said bistable electrical device is convertible between a high electrical resistance state and a low electrical resistance state when a first voltage is applied between said first and second electrodes and said bistable electrical device is convertible between said low electrical resistance state and a high electrical resistance state when a second voltage is applied between said first and second electrodes, said second voltage having a greater magnitude than said first voltage.

3. A memory device comprising:

A) a bistable electrical device comprising:

a first electrode that includes a first electrode surface;

a layer of low conductivity material having a first surface and a second surface wherein said first surface of said layer of low conductivity material is in electrical contact with said first electrode surface;

a second electrode that includes a second electrode surface; and a buffer layer located between said second electrode surface and the second surface of said layer of low conductivity material;

B) a memory input element for applying a voltage to said bistable electrical device to convert said bistable electrical device between a low electrical resistance state and a high electrical resistance state; and C) a memory readout element which provides an indication of whether said bistable electrical device is in said low electrical resistance state or said high electrical resistance state, wherein said buffer layer is constructed of a material and a form to provide control of metal ion migration from said second electrode to said layer of low conductivity material when a voltage is applied between said first and second electrodes to thereby provide a bistable behavior of said bistable electrical device, and wherein said memory readout element is a light emitting diode.

4. A bistable electrical device that is convertible between a low resistance state and a high resistance state, said device comprising:

a first electrode that includes a first electrode surface;

a layer of low conductivity material having a first surface and a second surface wherein said first surface of said layer of low conductivity material is in electrical contact with said first electrode surface;

a second electrode that includes a second electrode surface; and a buffer layer located between said second electrode surface and the second surface of said layer of low conductivity material, wherein said buffer layer is constructed of a material and a form to provide control of metal ion migration from said second electrode to said layer of low conductivity material when a voltage is applied between said first and second electrodes to thereby provide a bistable behavior of said bistable electrical device, wherein said bistable electrical device is convertible between a high electrical resistance state and a low electrical resistance state when a first voltage is applied between said first and second electrodes and said bistable electrical device is convertible between said low electrical resistance state and a high electrical resistance state when a second voltage is applied between said first and second electrodes, said second voltage having a greater magnitude than said first voltage, wherein said layer of low conductivity material comprises an inorganic material, and wherein said inorganic material comprises a material selected from the group of materials consisting of silicon, gallium and gallium nitride.

5. A bistable electrical device according to claim 2 wherein said diode is a light emitting diode.

6. A bistable electrical device according to claim 2 or 3, wherein said layer of low conductivity material comprises an inorganic material.

7. A bistable electrical device according to claim 2 or 4, wherein said second electrode consists essentially of copper.

8. A bistable electrical device according to claim 1, 2 or 4 wherein said second electrode comprises a metal selected from the group of metals consisting of metals having a relatively high diffusion coefficient in said layer of low conductivity material.

9. A bistable electrical device according to claim 1, 2 or 4, wherein said second electrode comprises a metal selected from the group of metals consisting of copper, gold, and silver.

10. A bistable electrical device according to claim 1, 2, 3 or 4 wherein said buffer layer is from 1 nanometer to 50 nanometers thick.

11. A bistable electrical device according to claim 1, 2, 3 or 4 wherein said buffer layer comprises particles of a low conducting material or insulating material that substantially covers said second electrode surface.

12. A bistable electrical device according to claim 1, 2, 3 or 4 wherein said buffer layer comprises a low conducting material or insulating material selected from the group consisting of sodium chloride, lithium fluoride and aluminum oxide.

13. A bistable electrical device according to claim 1, 2, 3 or 4 wherein said buffer layer is from 2 nanometers to 5 nanometers thick.

14. A bistable electrical device according to claim 10 wherein said buffer layer is from 1 nanometer to 10 nanometers thick.

* * * * *